(12) United States Patent
Yang et al.

(10) Patent No.: US 11,094,969 B2
(45) Date of Patent: Aug. 17, 2021

(54) BATTERY PACK AND DATA TRANSMISSION METHOD BETWEEN THE BATTERY PACK AND ELECTRICAL DEVICE

(71) Applicant: Nanjing Chervon Industry Co., Ltd., Nanjing (CN)

(72) Inventors: Dezhong Yang, Nanjing (CN); Zhao Hu, Nanjing (CN); Dongyue Wang, Nanjing (CN); Yang Wang, Nanjing (CN); Yunfeng Hu, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 0 days.

(21) Appl. No.: 16/887,664

(22) Filed: May 29, 2020

(65) Prior Publication Data

US 2020/0295408 A1 Sep. 17, 2020

Related U.S. Application Data

(63) Continuation of application No. PCT/CN2018/122770, filed on Dec. 21, 2018.

(51) Int. Cl.
*H01M 10/42* (2006.01)
*H01M 10/623* (2014.01)
(Continued)

(52) U.S. Cl.
CPC .......... *H01M 10/425* (2013.01); *G01R 31/28* (2013.01); *G01R 31/364* (2019.01);
(Continued)

(58) Field of Classification Search
CPC ............. H01M 10/425; H01M 10/623; H01M 10/482; H01M 2/1077; H01M 2010/4278;
(Continued)

(56) References Cited

U.S. PATENT DOCUMENTS 9,301,337 B2 *   3/2016  Brown ...................... H04B 5/02
2015/0185289 A1 * 7/2015  Yang ....................... G01R 31/68
                                                          324/434
(Continued)

FOREIGN PATENT DOCUMENTS

CN      101068196 A     11/2007
CN      103698711 A      4/2014
(Continued)

OTHER PUBLICATIONS

ISA/CN, International Search Report issued on PCT application No. CN20181122770, dated Mar. 6, 2019, 2 pages.

(Continued)

*Primary Examiner* — Nathaniel R Pelton
(74) *Attorney, Agent, or Firm* — Greenberg Traurig, LLP

(57) ABSTRACT

A battery pack includes a housing, a battery cell group accommodated in the housing, a plurality of battery pack connection terminals coupled to the connection terminals of an electrical device, including a battery pack positive power terminal electrically connected to a positive pole of the battery cell group, a battery pack negative power terminal electrically connected to a negative pole of the battery cell group, a first battery pack terminal to transmit a first type of data, and a second battery pack terminal to transmit a second type of data. Also, a data transmission method between the battery pack and the electrical device enables data collection for data analysis while ensuring normal operation of the battery pack and the electrical device.

13 Claims, 22 Drawing Sheets

(51) Int. Cl.

| | |
|---|---|
| *G01R 31/385* | (2019.01) |
| *G01R 31/364* | (2019.01) |
| *G01R 31/374* | (2019.01) |
| *H02J 7/00* | (2006.01) |
| *G01R 31/28* | (2006.01) |
| *H01M 10/48* | (2006.01) |
| *G01R 31/36* | (2020.01) |
| *G01R 31/392* | (2019.01) |
| *G01R 31/382* | (2019.01) |
| *H02J 50/80* | (2016.01) |
| *H01M 50/20* | (2021.01) |

(52) U.S. Cl.
CPC ....... *G01R 31/3648* (2013.01); *G01R 31/374* (2019.01); *G01R 31/382* (2019.01); *G01R 31/385* (2019.01); *G01R 31/392* (2019.01); *H01M 10/482* (2013.01); *H01M 10/623* (2015.04); *H01M 50/20* (2021.01); *H02J 7/00* (2013.01); *H02J 7/0013* (2013.01); *H02J 7/00036* (2020.01); *H02J 50/80* (2016.02); *H01M 2010/4278* (2013.01)

(58) Field of Classification Search
CPC ........ H02J 7/00036; H02J 7/00; H02J 7/0013; H02J 50/80; G01R 31/385; G01R 31/392; G01R 31/382; G01R 31/364; G01R 31/374; G01R 31/28; G01R 31/3648

USPC ........................................................ 320/112
See application file for complete search history.

(56) References Cited

U.S. PATENT DOCUMENTS

| | | | |
|---|---|---|---|
| 2018/0126537 A1* | 5/2018 | Tanaka | ................. G05B 13/024 |
| 2020/0227931 A1* | 7/2020 | Yamaguchi | ........... H01M 10/48 |
| 2020/0233658 A1 | 7/2020 | Yang et al. | |

FOREIGN PATENT DOCUMENTS

| | | |
|---|---|---|
| CN | 103703652 A | 4/2014 |
| CN | 104659431 A | 5/2015 |
| CN | 104753128 A | 7/2015 |
| CN | 104798283 A | 7/2015 |
| CN | 106056875 A | 10/2016 |
| WO | 2015061370 A1 | 4/2015 |
| WO | 2019105466 A1 | 6/2019 |

OTHER PUBLICATIONS

United States Patent and Trademark Office, Office Action issued in U.S. Appl. No. 16/887,584, dated Sep. 3, 2020, 8 pgs.
United States Patent and Trademark Office, Final Office Action issued in U.S. Appl. No. 16/887,584, dated Dec. 14, 2020, 7 pgs.

* cited by examiner

US 11,094,969 B2

BATTERY PACK AND DATA TRANSMISSION METHOD BETWEEN THE BATTERY PACK AND ELECTRICAL DEVICE

RELATED APPLICATION INFORMATION

The present application claims the benefit of International Application Number PCT/CN2018/122770, filed on Dec. 21, 2018, which application claims the benefit of Chinese Patent Application No. 201711392631.2, filed on Dec. 21, 2017, in the SIPO (State Intellectual Property Office—Chinese Patent Office), which applications are incorporated herein by reference in their entirety.

FIELD

The present disclosure relates to a battery pack and a data transmission method between the battery pack and an electrical device, and in particular to a battery pack that facilitates data collection and a data transmission method between the battery pack and an electrical device.

BACKGROUND

With the development of battery technology, power tools are gradually replacing engine tools. In order to achieve the working effect and battery life similar to that of an engine, the rated power and capacity of the battery pack are also increasing. When working outdoors, AC power is often needed to power some jobs or facilities. For this reason, portable power supply devices that can continuously provide AC power have emerged.

In the process of manufacturing prototypes of battery packs and electrical devices used with the battery packs (for example, power tools, chargers, portable power supply devices), it is often necessary to consider the various functional requirements of the battery packs and electrical devices, such as a request for the portable power supply device to convert the DC power of the battery pack used to power the power tool into an AC output, and also a request to provide a DC charging current for the battery pack. This requires manufacturers to carry out a lot of on-site research to collect battery pack data and electrical device data for data analysis in order to meet customer needs, which costs a lot of manpower and material resources. However, it often fails to design a satisfactory product despite spending a lot of manpower and material resources. In addition, when the equipment breaks down and needs to be repaired, it is necessary for the maintenance staff to rush to the scene to analyze the situation before giving a diagnosis, which also brings inconvenience to the maintenance work.

SUMMARY

To solve the deficiencies of the prior art, a purpose of the present disclosure is to provide a battery pack that facilitates data collection.

In order to achieve the above and additional objectives, the present disclosure employs the following technical solutions:

An example battery pack comprises: a housing; a battery cell group accommodated in the housing, the battery cell group comprising a plurality of electrically connected battery cells; a plurality of battery pack connection terminals used to couple to the connection terminals of an electrical device; wherein the plurality of battery pack connection terminals comprises: a positive power terminal of the battery pack electrically connected to the positive pole of the battery cell group; a negative power terminal of the battery pack electrically connected to the negative pole of the battery cell group; a first battery pack terminal used to transmit a first type of data; a second battery pack terminal used to transmit a second type of data.

In a further example, the battery pack can be mounted to an electrical device, the electrical device comprising: a positive power connection terminal and a negative power connection terminal respectively used to couple to the battery pack positive power terminal and the battery pack negative power terminal for transmitting electrical energy; a first connection terminal used to couple to the first battery pack terminal to transmit the first type of data; a second connection terminal used to couple to the second battery pack terminal to transmit the second type of data. The battery pack has a normal operation mode and a data transmission mode. In the normal operation mode, the first battery pack terminal transmits the first type of data for normal operation of the battery pack and/or the electrical device connected to the battery pack. In the data transmission mode, the second battery pack terminal transmits the second type of data for data analysis of the battery pack and/or the electrical device connected to the battery pack.

In a further example, the battery pack comprises a controller. The controller controls the battery pack to switch between the normal operation mode and the data transmission mode.

In a further example, the battery pack comprises: an identification resistor or temperature sensor connected to the second battery pack terminal. In the normal operation mode, the second battery pack terminal is used to transmit the property of the battery pack or the temperature of the battery pack; at least one switching element electrically connected to the identification resistor or temperature sensor to turn on or off the electrical connection between the identification resistor or temperature sensor and the second battery pack terminal; the controller is used to control the on-off state of the switching element to switch the battery pack to the normal operation mode or the data transmission mode.

In a further example, the battery pack is switched to the data transmission mode once the normal operation mode ends.

In a further example, the electrical device has identity information. The identity information contains whether the electrical device has a wireless communication module. The wireless communication module is used to establish a wireless communication connection between the electrical device and an external device. The electrical device can send the second type of data to the external device through the wireless communication module. The external device includes a wireless communication module, and the external device has data processing and analysis functions. The first battery pack terminal is also used to obtain the identity information of the electrical device.

In a further example, the battery pack comprises: an identification resistor or temperature sensor connected to the second battery pack terminal. In the normal operation mode, the second battery pack terminal is used to transmit the property of the battery pack or the temperature of the battery pack; at least one switching element electrically connected to the identification resistor or temperature sensor to turn on or off the electrical connection between the identification resistor or temperature sensor and the second battery pack terminal; a controller at least used to control the on-off state of the switching element, the controller being configured to determine whether the electrical device has a wireless communication module based on the identity information of the electrical device obtained by the first battery pack terminal. If it is determined that the electrical device has wireless communication module, the controller controls the switching element to turn off the electrical connection between the identification resistor or temperature sensor and the second battery pack terminal so that the second battery pack terminal transmits the second type of data for data analysis.

In a further example, the second type of data includes at least one of history data, statistical data, and real-time data.

In a further example, the battery pack and/or the electrical device comprise a memory, and the data is respectively stored in specified partitions of the memory, according to different types of history data, statistical data and real-time data. When the specified partition is used up, current data overwrites old data.

In a further example, wherein the battery pack includes a wireless communication module for establishing a wireless communication connection with an external device, and the battery pack can send the second type of data to the external device through the wireless communication module; the external device comprises a wireless communication module, and the external device has data processing and analysis functions.

In a further example, the electrical device has a wireless communication module for establishing a wireless communication connection with an external device, and the electrical device can send the second type of data to the external device through the wireless communication module; the external device comprises a wireless communication module, and the external device has data processing and analysis functions.

In a further example, the electrical device and the battery pack have a unique identifier, and the second type of data contains the unique identifier.

In a further example, the second type of data contains the same time information, and the external device is configured to delete data of the same time and the same unique identifier.

In a further example, the electrical device is a power tool or a charger or a portable power supply device.

In a further example, the first battery pack terminal is used to transmit the first type of data and the second type of data, and the second battery pack terminal is used to transmit the first type of data and the second of type of data.

In a further example, at least one of the first battery pack terminal and the first connection terminal has a first data transmission rate, and at least one of the second battery pack terminal and the second connection terminal has a second data transmission rate that is higher than the first data transmission rate.

In a further example, the first type of data contains current state data of the battery pack and/or current operating condition data of the electrical device; the second type of data contains at least one of current state data, historical state data, and usage data of the battery pack, and/or at least one of current operating condition data, historical operating condition data, and usage data of the electrical device.

An example data transmission method between a battery pack and an electrical device (where the battery pack has a normal operation mode and a data transmission mode, the battery pack comprises a first battery pack terminal and a second battery pack terminal, the electrical device comprises a first connection terminal and a second connection terminal, the first connection terminal is used to connect with the first battery pack terminal, and the second connection terminal is used to connect with the second battery pack terminal) comprises: in the normal operation mode, the battery pack and the electrical device transmit the first type of data through the first battery pack terminal and the first connection terminal; In the data transmission mode, the battery pack and the electrical device transmit the second type of data through the second battery pack terminal and the second connection terminal.

In a further example, at the initial stage of connection between the battery pack and the electrical device, the battery pack operates in the normal operation mode, and once the normal operation mode ends, the battery pack switches to the data transmission mode.

In a further example, at the initial stage of connection between the battery pack and the electrical device, the battery pack operates in the normal operation mode, and once the normal operation mode ends, the battery pack determines whether the electrical device has a wireless communication module based on the identity information of the electrical device, and switches to the data transmission mode if it is determined that the electrical device has a wireless communication module.

In a further example, one of the battery pack and the electrical device has a wireless communication module for establishing a wireless communication connection with an external device. One of the battery pack and the electrical device can send the second type of data of the battery pack and the electrical device to the external device through the wireless communication module.

In a further example, the electrical device and the battery pack have a unique identifier, and the second type of data contains the unique identifier. The second type of data contains the same time information, and the external device is configured to delete data of the same time and the same unique identifier.

In a further example, the first type of data is data for normal operation of the battery pack and/or the electrical device, and the second type of data is data for data analysis of the battery pack and/or the electrical device.

In a further example, at least one of the first battery pack terminal and the first connection terminal has a first data transmission rate, and at least one of the second battery pack terminal and the second connection terminal has a second data transmission rate that is higher than the first data transmission rate.

In a further example, the first type of data contains current state data of the battery pack and/or current operating condition data of the electrical device; the second type of data contains at least one of current state data, historical state data, and usage data of the battery pack, and/or at least one of current operating condition data, historical operating condition data, and usage data of the electrical device.

The benefit of the present disclosure is that: the battery pack and the electrical device can transmit at least two types of data by providing two sets of connection terminals on the battery pack. The battery pack or the electrical device can be used to collect data of the battery pack and the electrical device to ensure normal operation and at the same time, collect a large amount of data for data analysis, so as to provide data support for research and development, facilitate maintenance staff in troubleshooting and failure repair, saving manpower and material resources.

DETAILED DESCRIPTION

The disclosure will be further described in detail below with reference to the drawings and examples. It can be understood that the specific examples described herein are only used to explain the present disclosure, rather than to limit the present disclosure. In addition, it should be noted that, for the ease of description, the drawings only show the parts related to the present disclosure, but not all structures.

Figure 1:
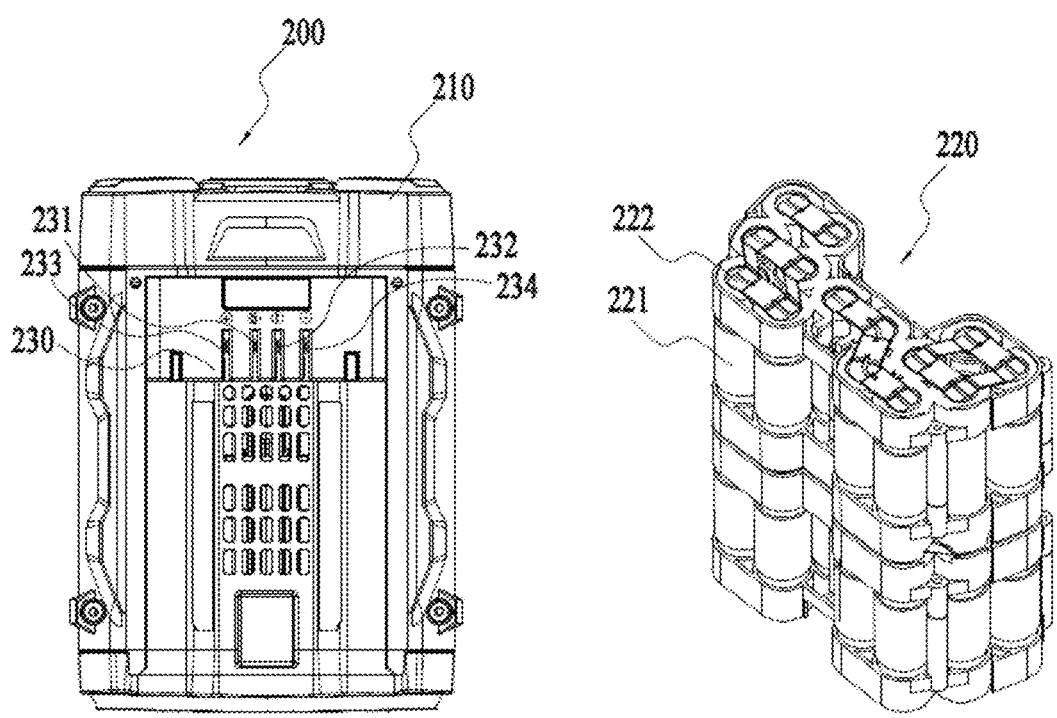
FIG. 1 is a structural diagram of a battery pack, according to an example.

Referring to FIG. 1, an example of a battery pack 200 mainly includes: a housing 210; a battery cell group 220 accommodated in the housing 210, the battery cell group 220 including a plurality of battery cells 221; and a plurality of battery pack connection terminals 230 used to couple to the connection terminals of an electrical device connected to the battery pack 200;

The battery cell group 220 is accommodated in the housing 210, and includes more than one series module. When the number of series modules is greater than or equal to 2, different series modules are connected in series and the whole of them constitutes the battery cell group 220. A series module includes more than one battery cells 221. When the number of battery cells 221 in the same series module is greater than 2, different cells 221 are connected in parallel to form a series module. The battery cells 221 are used to store energy, which can be repeatedly charged and discharged. The battery cells 221 are electrically connected through cell interconnects 222.

The plurality of battery pack connection terminals 230 include a battery pack positive power terminal 233 and a battery pack negative power terminal 234. The battery pack positive power terminal 233 is electrically connected to the positive pole of the battery cell group 220, and the battery pack negative power terminal 234 is electrically connected to the negative pole of the battery cell group 220. In the present example, the plurality of battery pack connection terminals 230 further includes a first battery pack terminal 231 and a second battery pack terminal 232, wherein the first battery pack terminal 231 is used to transmit the first type of data, and the second battery pack terminal 232 is used to transmit the second type of data. The first type of data is data for normal operation, and the second type of data is data for data analysis. In this way, the battery pack 200 can not only transmit data during normal operation but also transmit data for data analysis, ensuring normal operation and data collection.

In other examples, the first battery pack terminal may also be used to transmit the first type of data and the second type of data, and the second battery pack terminal may be used to transmit the first type of data and the second of type of data.

Since the first type of data is data for normal work, the second type of data is data for data analysis, the second type of data has a larger amount of data than the first type of data. In an example, at least one of the first battery pack terminal 231 and the first connection terminal has a first data transmission rate, and at least one of the second battery pack terminal 232 and the second connection terminal has a second transmission rate higher than the first the first data transmission rate. The advantage of this is that the transmission rate of transmitting the second type of data is higher than the transmission rate of the first type of data. Distinguishing the transmitting rate for different types of data ensures that the two types of data can be efficiently transmitted without increasing cost.

The strong anti-interference performance of low-speed communication benefits when work in a strong interference electromagnetic environment such as motor control, while the anti-interference performance of the high-speed communication is weaker than the low-speed communication, but the data transmission capability of the high-speed communication is strong. Therefore, in an example, the first connection terminal or the first battery pack terminal of the first data transmission rate may be provided only in one of the battery pack and the electrical device where the electromagnetic interference is strong, and the second connection terminal or the second battery pack terminal of the second data transmission rate may be provided only in one of the battery pack and the electrical device where the electromagnetic interference is weak. Hereby, the effect of strong electromagnetic influence on the data transmission reliability can be avoided.

Figure 2:
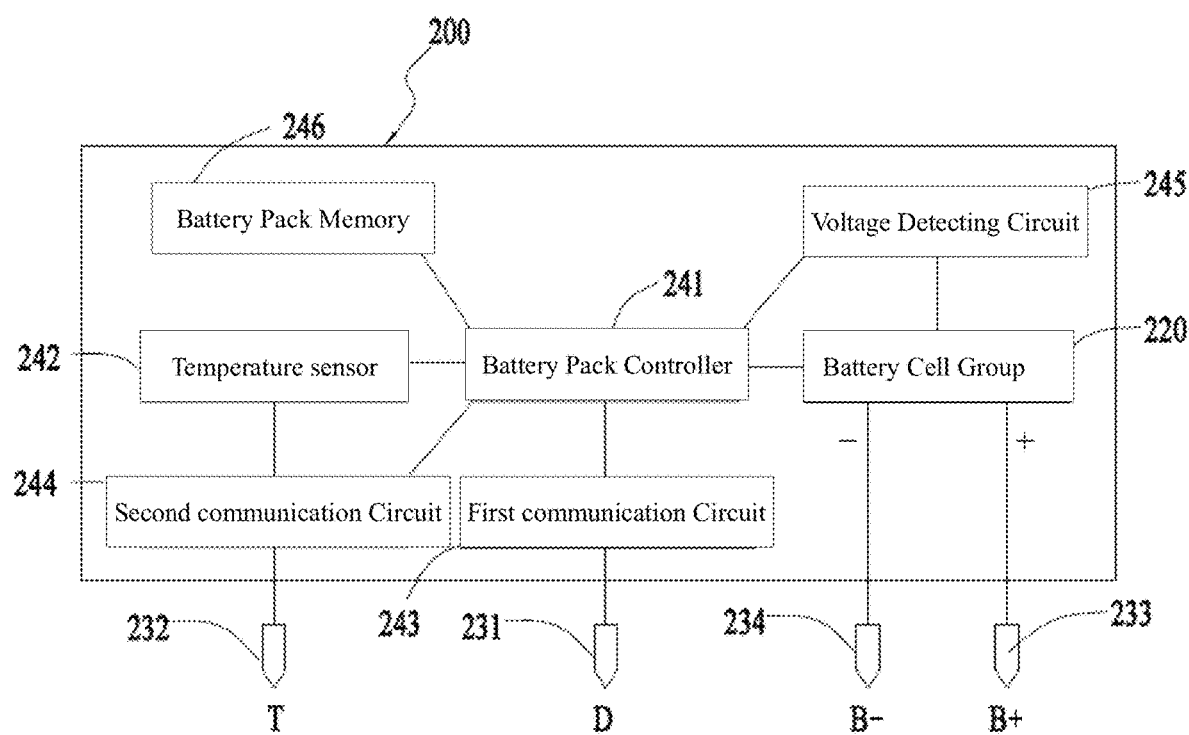
FIG. 2 is a schematic circuit diagram of a battery pack, according to an example.

Referring to FIG. 2, the normal operation of the battery pack 200 also relies on circuit components. The circuit components mainly include a battery pack controller 241, a temperature sensor 242, a first communication circuit 243, a second communication circuit 244, and a voltage detecting circuit 245.

The battery pack controller 241 is mainly used to implement functions such as logic operation and process control, and can control various circuit components in the battery pack 200 to ensure the safety of the battery pack 200 during charging and discharging. The battery pack controller 241 may be a chip having a control function such as a single chip microcomputer.

The temperature sensor 242 is used for detecting the internal temperature of the battery pack 100. The temperature sensor 242 is connected to the second communication circuit 243, and the second communication circuit 243 is connected to the second battery pack terminal 232, so that the temperature sensor 242 can be electrically connected to the second battery pack terminal 232, thereby, the electrical device connected to the battery pack 200 is capable of obtaining the temperature of the battery pack 200 by connecting to the second battery pack terminal 232, which is used for transmitting the temperature of the battery pack.

The temperature sensor 242 is disposed inside the battery pack 200. Specifically, the temperature sensor 242 is disposed in the battery pack 200 at a position close to the battery cell 221 so that it can detect a change in the temperature of the battery cell 221. In an example, the temperature sensor 242 may employ a thermistor, especially an NTC thermistor.

Alternatively, the temperature sensor 242 may be electrically coupled to the battery pack controller 241 to feed back the detection result of the temperature sensor 242 to the battery pack controller 241 and is controlled by the battery pack controller 241.

In other examples, the battery pack 200 includes a battery pack identification resistor (not shown) for characterizing the properties of the battery pack, such as the voltage of the battery pack or the chemistry of the battery, the battery pack identification resistor and the second communication circuits 244 are electrically connected such that the battery pack identification resistor can be electrically connected to the second battery pack terminal 232, so that the electrical device connected to the battery pack 200 can obtain the properties of the battery pack 200 through the connection with the second battery pack terminal 232. At this time, the second battery pack terminal 232 is used to transmit the properties of the battery pack 200. When the battery pack is mounted to the electrical device, the electrical device can measure the voltage of the identification resistor through the connection with the second battery pack terminal 232, thereby obtaining the resistance value of the identification resistor according to the voltage, thereby acquiring the properties of the battery pack 200.

The first communication circuit 243 is electrically coupled to the battery pack controller 241 to realize data exchange or signal exchange. The first communication circuit 243 can implement data transmission by hardware connection or wireless connection. Since the battery pack 100 has a high voltage and output power, when it is connected to an electrical device such as a charger, a power tool, or a portable power supply device, high connection reliability is required. In an example, the first communication circuit 243 implements data transmission by means of hardware connection. The first communication circuit 243 is connected to the first battery pack terminal 231 for data transmission. When the battery pack 200 is mounted to an external electrical device, the first battery pack terminal 231 can be physically connected to a corresponding terminal of the external electrical device.

The second communication circuit 244 is electrically coupled to the temperature sensor 242 to convert the signal of the temperature sensor 242 into an electrical signal recognizable by an external electrical device connected to the battery pack 200. The second communication circuit 244 is also electrically coupled to the battery pack controller 241 and is controlled by the battery pack controller 241.

Optionally, the battery pack 200 may further includes a voltage detecting circuit 245 for detecting voltage values of respective series modules 111 in the battery cell group 220, and the voltage detecting circuit 245 is electrically connected to the battery cell group 220 and the battery pack controller 241, respectively.

The voltage detecting circuit 245 detects the voltage signals in the battery cell group 220 and transmits the voltage signals to the battery pack controller 241. The battery pack controller 241 calculates voltage values according to the voltage signals transmitted by the voltage detecting circuit 245 to implement voltage safety monitoring the battery pack 100.

In some examples, the battery pack 200 further includes a battery pack memory 246 to store data of the battery pack, as well as data of the electrical device connected to the battery pack 200. Specifically, when the battery pack 200 is assembled to an electrical device such as the charger 400, the power tool 300, the portable power supply device 100, the data of the electrical device is acquired through the connection of the second battery pack terminal 232 to the connection terminal of the electrical device, and stored on the battery pack memory 246. The battery pack memory 246 stores the data as a second type of data for data analysis.

In some examples, the battery pack 200 further includes a battery pack power display module (not shown in FIG. 2) electrically connected to the battery pack controller 241, and the battery pack power display module is configured to display the remaining amount of power in the battery pack 200.

The electrical device capable of being connected to the battery pack 200 includes a positive power connection terminal, a negative power connection terminal, a first connection terminal, and a second connection terminal, wherein the positive power connection terminal and the negative power source connection terminal are respectively connected to the battery pack positive power terminal 233 and the battery pack negative power terminal 234 to transmit electrical energy. The first connection terminal is connected to the first battery pack terminal 231 to transmit the first type of data; and the second connection terminal is connected to the second battery pack terminal 232 to transmit the second type of data.

The battery pack 200 can be mounted to an electrical device. When the battery pack 200 is mounted to the electrical device, the positive power connection terminal is connected to the battery pack positive power terminal 233, and the negative power connection terminal is connected to the battery pack negative power terminal 234. The first connection terminal is connected to the first battery pack terminal 231, and the second connection terminal is connected to the second battery pack terminal 232.

The battery pack 200 has a normal operation mode and a data transmission mode. In the normal operation mode, the first battery pack terminal 231 transmits the first type of data for the normal operation of the battery pack 232 and/or the electrical device connected to the battery pack 200. In the data transmission mode, the second battery pack terminal 232 transmits the second type of data for data analysis of the battery pack 200 and/or the electrical device connected to the battery pack 200.

In order to switch the battery pack 200 between the normal operation mode and the data transmission mode, the battery pack controller 241 is further configured to control the battery pack 200 to switch between the normal operation mode and the data transmission mode.

In order to switch between the normal operation mode and the data transmission mode of the battery pack 200, the second communication circuit 244 further includes at least one switching element electrically connected to the temperature sensor 242 to turn on or turn off the electrical connection between the temperature sensor 242 and the second battery pack terminal 232. The controller 241 is configured to control an on-off state of the switching element to switch the battery pack 200 to the normal operation mode or the data transmission mode. The switching element may be a semiconductor switch (e.g., a triode, a field effect transistor), or may be another switch having a control terminal connected to the battery pack controller 241. Of course, in other examples, the temperature sensor 242 may also be replaced with an identification resistor.

Figure 3:
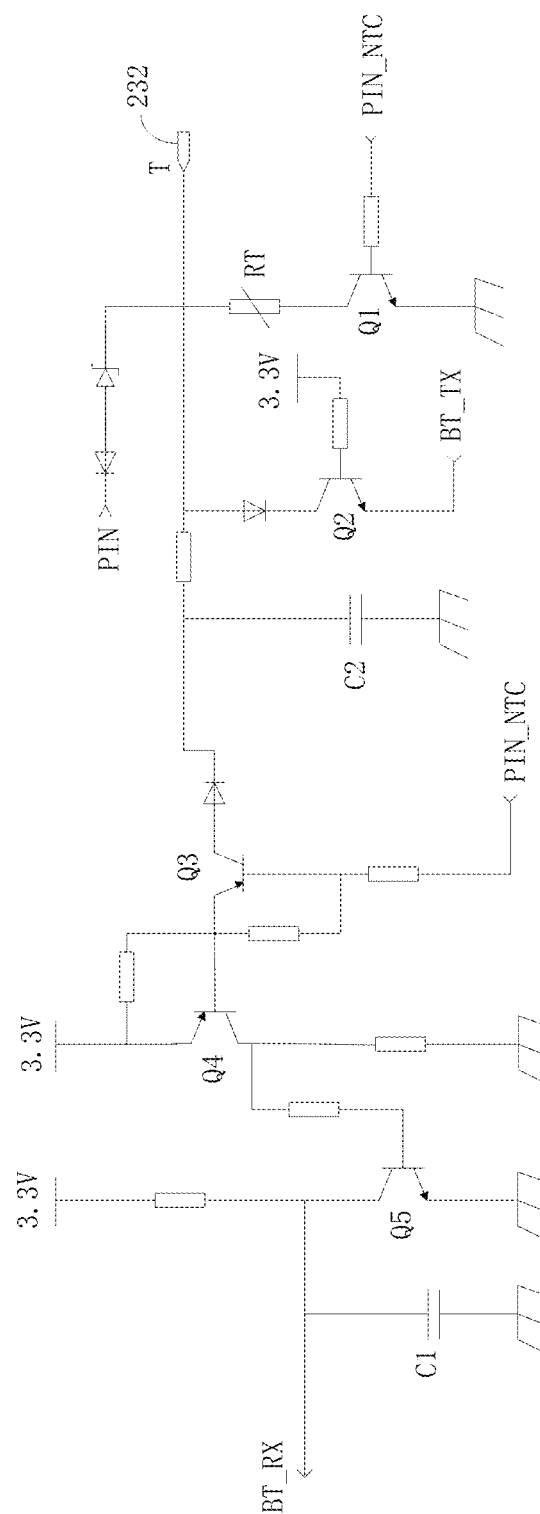
FIG. 3 is a second communication circuit of the battery pack in the example shown in FIG. 2.

Referring to FIG. 3, in an example of the second communication circuit 244, RT is a temperature sensor 242 for detecting the temperature of the battery pack 200, specifically, an NTC thermistor RT. One end of the thermistor RT is connected to the second battery pack terminal 232 of the battery pack 200, and the other end of the thermistor RT is connected to one end of the transistor Q1. The control end of the transistor Q1 is connected to the control signal output terminal PIN_NTC of the battery pack controller 241 through resistor D1. The other end of the transistor Q1 is grounded.

The second communication circuit 244 also includes a transistor Q3 to control the battery pack 200 to be in a receiving state or a transmitting state.

In the normal operation mode, the battery pack controller 241 sets the control signal output terminal PIN_NTC high, turns the transistor Q1 on and the transistor Q3 off, and the thermistor RT connects the second communication circuit 244 to collect the temperature of the battery pack 200. The second battery pack terminal 232 transmits the temperature of the battery pack, and the first battery pack terminal 231 transmits the first type of data for normal operation, such as the charging current or discharging current during charging or discharging of the battery pack, single cell voltage, cell group voltage. The first battery pack terminal 231 may also transmit data of the electrical device connected to the battery pack, the data being related to a specific electrical device. The first type of data is used to maintain the normal operation of the electrical device and the battery pack 200 and protect the battery pack 200 and the electrical device.

The advantage is that the second battery pack terminal 232 can not only transmit the second type of data for data analysis of the electrical device and the battery pack 200, but also can be used to transmit the temperature and properties of the battery pack 200. Realizing two functions with one terminal reduces the number of terminals used, reduces cost, and can be used for data transmission while ensuring normal operation with a low cost.

In an example, once the normal operation mode ends, that is, once the battery pack 200 stops charging or discharging, the battery pack 200 switches to the data transmission mode. Specifically, the battery pack controller 241 controls the switching element to switch the battery pack 200 to the data transmission mode.

The advantage is that the battery pack 200 only switches to the data transmission mode after the normal operation mode ends, that is, after the battery pack 200 stops charging or discharging, can avoid the situation of switching to the data transmission mode suddenly when the normal operation mode has not ended, which may cause system disorder that affects the normal operation of the battery pack 200 and the electrical device and damages the battery pack and the electrical device, and the reliability of the transmitted data. In addition, comparing with switching to the data transmission mode before the normal operation mode, switching to the data transmission mode after the normal operation mode can send the second type of data of the battery pack 200 and the electrical device in time through the wireless communication module, avoiding long time occupation.

Specifically, the battery pack controller 241 sets the control signal output terminal PCB_NTC low to turn on Q3 and turn off Q1, no current passes through the thermistor RT, and the thermistor RT is disconnected from the second battery pack terminal 232. Thus, the battery pack 200 can transmit data to the electrical device through the data transmitting end BT_TX, and receive data of the electrical device from the data receiving end BT_RX. The controller of the battery pack 200 initializes the BT_RX and BT_TX terminals to be serial port, so that the second battery pack terminal 232 becomes a two-way serial port.

At this time, the second battery pack terminal 232 is used to transmit the second type of data for data analysis. For example, the battery pack 200 may send the current State of Charge (SOC) and State of Health (SOH) data of the battery pack 200 to the electrical device through the second battery pack terminal 232, as well as history data and/or statistical data stored in battery pack memory 246, including the fault information, the number of uses, the maximum voltage/current, the current actual capacity of the battery pack 200, and/or the second type of data of other electrical devices collected by the battery pack 200. The battery pack 200 may also receive the second type of data of the electrical device through the second battery pack terminal 232, including the current state data of the electrical device and/or history data and/or statistical data stored in the memory of the electrical device.

The battery pack of the present disclosure has two modes, a normal operation mode and a data transmission mode. Through the two terminals (the first battery pack terminal 231 and the second battery pack terminal 232), the first type of data is transmitted in the normal operation mode and the second type of data is transmitted in the data transmission mode. Data collection can be performed while ensuring normal operation.

In an example, the battery pack 200 or the electrical device includes a wireless communication module, and the wireless communication module is configured to establish a wireless communication connection between the battery pack or the electrical device and the external device. Through the wireless communication module, the battery pack or the electrical device can transmit the collected second type of data to the external device. The external device includes a communication device, and the communication device includes a wireless communication module having data processing and analysis functions.

Thus, the second type of data of the battery pack and the second type of data of the electrical device collected through the second battery pack terminal 232 by the battery pack 200 can be transmitted to the external device through the wireless communication module disposed on the battery pack 200. Or, the second type of data of the electrical device and the second type of data of the battery pack 200 collected through the second battery pack terminal 232 by the electrical device can be transmitted to the external device through a wireless communication module disposed on the electrical device. The external device has data processing and the analysis function, so that the external device can provide data support for research and development of the battery pack and the electrical device after processing and analysis of the second type of data, and also facilitate the maintenance staff to diagnose and repair the battery pack 200 and the electrical device, saving manpower and material resources.

The wireless communication module can act as a wireless router of a local area network, which can directly access the Internet or can communicate with a wireless communication device capable of accessing the Internet to enable other wireless communication devices in the local area network to access the Internet. Of course, the wireless communication module may alternatively only realize data interaction for the wireless communication devices within the local area network. The wireless communication device may realize wireless communication by using Bluetooth, WiFi, NFC, ZigBee, and the like.

The external device may include a remote server having data processing and analysis functions, the remote server including a wireless communication module. Data transmits between the battery pack 200 or the electrical device and the remote server through respective wireless communication modules. Of course, the external device can also transmit data to the portable power supply device 100 through the wireless communication module.

The external device may further include a mobile terminal device (for example, a mobile phone) with data transmitting and receiving functions; the mobile terminal device includes a wireless communication module, and the mobile terminal device, the remote server, or the electrical device transmits data through respective wireless communication modules. Hereby, the mobile terminal device can send an instruction or data to the electrical device through the wireless communication module, and can also receive data of the electrical device or the battery pack 200. The mobile terminal device includes a display module capable of displaying the information sent by the battery pack 200 or the electrical device, including the current status information of the electrical device or battery pack, such as the remaining battery capacity of the battery pack, the remaining available time, etc. The display interface makes it convenient for the user to check and to determine whether to charge or discharge the battery pack, and whether to end the work in progress to save electric power.

In this way, the battery pack 200 or the electrical device can transmit the collected second type of data for data analysis to the remote server through the wireless communication module for data processing and analysis, provide support for research and development, fault diagnosis; or transmit the collected second type of data to the mobile terminal device for the convenience of the user to check the status of the electrical device or the battery pack to arrange the next work. For example, whether the number of failures of the electrical device has reached the upper limit that needs to repair, and whether the temperature of the battery pack 200 has reached the upper limit that needs to suspend.

Of course, the wireless communication method of the wireless communication module can also be replaced by a wired communication method. However, considering the complexity of the battery pack and the electrical device operating conditions and the limitation of the environment, the wireless communication mode of the wireless communication module is used to send the collected data to external devices, which makes the operation more convenient and saves manpower and material resources.

Following the above approach, by providing the second battery pack terminal 232 and the corresponding second connection terminal of the electrical device, the battery pack 200 or the electrical device can be used to collect the second type of data for data analysis of the battery pack and the electrical device. There is no need to separately collect the second type of data for data analysis of the electrical device and the battery pack 200 by using other devices, thereby ensuring the operation of the electrical device and the battery pack 200, and simultaneously realizing data collection, saving additional data collection equipment. In addition, switching to data transmission mode once normal operation mode ends makes data collection more automatic and convenient. Compared with the traditional data separately collected for the battery packs 200 and electrical devices, the data of the battery pack and the electrical device collected by the electrical device or the battery pack 200 is more concentrated, which can facilitate subsequent data processing and analysis work, such as data deduplication and data classification, saving manpower, material and time.

In an example, the external device is a remote server. In order to facilitate the analysis and processing of the data received by the remote server 20, the second type of data of the electrical device or of the electrical device collected by the battery pack 200 and of the battery pack 200 are categorized into three types of data: real-time data, statistical data, and history data. The data is respectively stored in specified memory partitions of the battery pack 200 or the electrical device according to different types of history data, statistical data, and real-time data. When the specified memory partition is used up, the original data will be overwritten by the current data. This scrolling storage method saves the latest data and saves the storage space.

In order to distinguish data of different devices (battery packs and electrical devices), device identity information may be added or associated with the above three types of data in order to track the full life cycle state of the product. In some examples, the device identity information is a unique identifier. In the above approach, the electrical device and the battery pack have unique identifiers, and the second type of data includes a unique identifier. The electrical device may be a portable power supply device 100, a power tool 300 and a charger 400.

Since the data is divided into real-time data, statistical data, and history data with time attributes, it is necessary to add or associate time information to the above data. In other words, at least one of the above three types of data, real-time data, statistical data, and history data contains time information, and such data with time information is necessary for big data analysis later. Due to the inconsistency of time in various regions and countries of the world, in order to ensure the time synchronization or time consistency for data in various regions, the time in the data is measured in UTC. The battery pack 200 or the electrical device having the wireless communication module acquires the world standard time from an external device having world standard time information, and the battery pack or the electrical device calibrates its own time information using the acquired world standard time, when the electrical device or the battery pack 200 is connected to the battery pack 200 or the electrical device, the battery pack 200 or the electrical device transmits the acquired world standard time calibration to the electrical device or the battery pack 200 through the connection terminal. The method passes the standard time step by step. According to the above, the data generated or transmitted by the battery pack 200 and the electronic device can maintain the time synchronization or time consistency in various regions of the world, which is convenient for unified management.

As a result of the above approach, the second type of data sent by the electronic device or the battery pack 200 to the remote server through the wireless communication module may appear or be associated with the same time and the same unique identifier, resulting in data duplication. In order to reduce the amount of data stored and facilitate data sorting, in an example, a deduplication function can be introduced in the remote server, that is, a function that distinguishes the order of data according to its time to remove redundant data with the same time and the same unique identifier, so as to avoid data duplication and conflicts.

In order to minimize the size of the battery pack, in the present example, the battery pack 200 does not include a wireless communication module.

It should be contemplated that, when the current electrical device does not have a wireless communication module, the second type of data of the battery pack 200, the second type of data stored in the battery pack memory 246 of other electronic devices that once connected to the battery pack 200, and the second type of data of the electronic device cannot be transmitted to the external device through the wireless communication module of the electrical device. In this case, if the battery pack 200 still transmits the second type of data of the battery pack 200 and/or the second type of data stored in the battery pack memory 246 of other electronic devices that once connected to the battery pack 200 to the electrical device, then not only the second type of data of the battery pack 200 cannot be transmitted to the external device through the electrical device, but also the memory space of the electrical device will be also occupied. In order to solve this problem, the battery pack 200 transmits the second type of data to the electrical device only when the electrical device has a wireless communication module.

In order to distinguish whether the electrical device has a wireless communication module, the electrical device has identity information, and the identity information includes whether the electrical device has a wireless communication module, and the wireless communication module is used to establish a wireless communication connection between the electrical device and the external device, and the electrical device can transmit the second type of data to the external device through the wireless communication module.

In some specific examples, the identity information may be a serial number stored in a memory of the electrical device, and the memory is further capable of storing the second type of data of the battery pack 200 used for data analysis and the second type of data of the electrical device used for data analysis.

The serial number is the device model of the electrical device, and the battery pack 200 can read the serial number through the first battery pack terminal 231 to determine whether the electrical device has a wireless communication module; in other specific examples, the resistance value of an identification resistor can be used to represent the identity information of the electronic device. The battery pack 200 can measure the voltage of the identification resistor through the first battery pack terminal 231 and obtain the resistance value of the identification resistor from the voltage, thereby determine whether the electrical device has a wireless communication module.

When the battery pack 200 is connected to the electrical device, the first battery pack terminal 231 is further configured to acquire the identity information of the electrical device. This has the advantage that the first battery pack terminal 231 can not only transmit the first type of data for the normal operation of the electrical device and the battery pack 200, but also can detect whether the electrical device has a wireless communication module. Realizing two functions with one terminal reduces the number of terminals used, reduces cost, and can be used for data transmission while ensuring normal operation with a low cost.

The battery pack controller 241 is configured to: determine whether the electrical device has a wireless communication module based on the identity information of the electrical device obtained by the first battery pack terminal 231; and after determining that the electrical device has the wireless communication module, control the switching elements (Q1 and Q3 in FIG. 3) of the second communication circuit 244 to disconnect the electrical connection between the temperature sensor 242 or the identification resistor in the battery pack 200 and the second battery pack terminal 232 to cause the second battery pack terminal 232 to transmit the second type of data used for data analysis.

According to the above approach, after the normal operation mode ends, that is, after the battery pack 200 ends charging or discharging, the battery pack 200 acquires the identity information of the electrical device through the first battery pack terminal 231, and the battery pack controller 241 determines whether the electrical device has a wireless communication module. If yes, the battery pack 200 transmits the second type of data for data analysis through the second battery pack terminal 232. If not, the battery does not transmit the second type of data used for data analysis through the second battery pack terminal 232 after the normal operation mode ends.

In this way, after the normal operation mode ends, if the electrical device has a wireless communication module, the second type of data of the electrical device and the battery pack can be sent to the external device through the wireless communication module promptly to avoid occupying the memory of the electrical device and the battery pack for a long time.

The present disclosure also provides a data transmission method of the above battery pack 200 and the electrical device. As described above, the battery pack 200 has a normal operation mode and a data transmission mode, and the battery pack 200 includes a first battery pack terminal 231 and a second battery pack terminal 232. The electrical device includes a first connection terminal and a second connection terminal, the first connection terminal being used for connecting to the first battery pack terminal 231, and the second connection terminal being used for connecting to the second battery pack terminal 232. The data transmission method includes:

In the normal operation mode, the battery pack 200 and the electrical device transmit the first type of data through the first battery pack terminal 231 and the first connection terminal;

In the data transmission mode, the battery pack 200 and the electrical device transmit the second type of data through the second battery pack terminal 232 and the second connection terminal.

In an example, at the initial stage in which the battery pack 200 gets connected to the electrical device, the battery pack 200 operates in a normal operation mode, and after the normal operation mode ends, the battery pack 200 switches to the data transmission mode.

In another example, at the initial stage in which the battery pack 200 gets connected to the electrical device, the battery pack 200 operates in a normal operation mode; and after the normal operation mode ends, the battery pack 200 checks whether the electrical device has a wireless communication module based on the identity information of the electrical device, and only when it is determined that the electrical device has a wireless communication module will the battery pack 200 switch to the data transmission mode.

One of the battery pack 200 and the electrical device has a wireless communication module for establishing a wireless communication connection with an external device. One of the battery pack 200 and the electrical device can transmit the second type of data of the battery pack 200 and the electrical device through the wireless communication module to the external device.

The electrical device and battery pack 200 have a unique identifier, the second type of data includes the unique identifier; the second type of data further includes the same time information, and the external device is configured to delete the data with the same time and the same unique identifier.

The first type of data is data for normal operation of the battery pack 200 and/or the electrical device, and the second type of data is data for data analysis of the battery pack 200 and/or the electrical device.

In an example, at least one of the first battery pack terminal 231 and the first connection terminal has a first data transmission rate, and at least one of the second battery pack terminal 232 and the second connection terminal has a second data transmission rate higher than the first data transmission rate.

In the present disclosure, the first type of data contains current state data of the battery pack and/or current operating condition data of the electrical device; the second type of data contains at least one of current state data, historical state data, and usage data of the battery pack, and/or at least one of current operating condition data, historical operating condition data, and usage data of the electrical device.

The following illustrates the solution of the present disclosure by taking several different electrical devices as examples.

Figure 4:
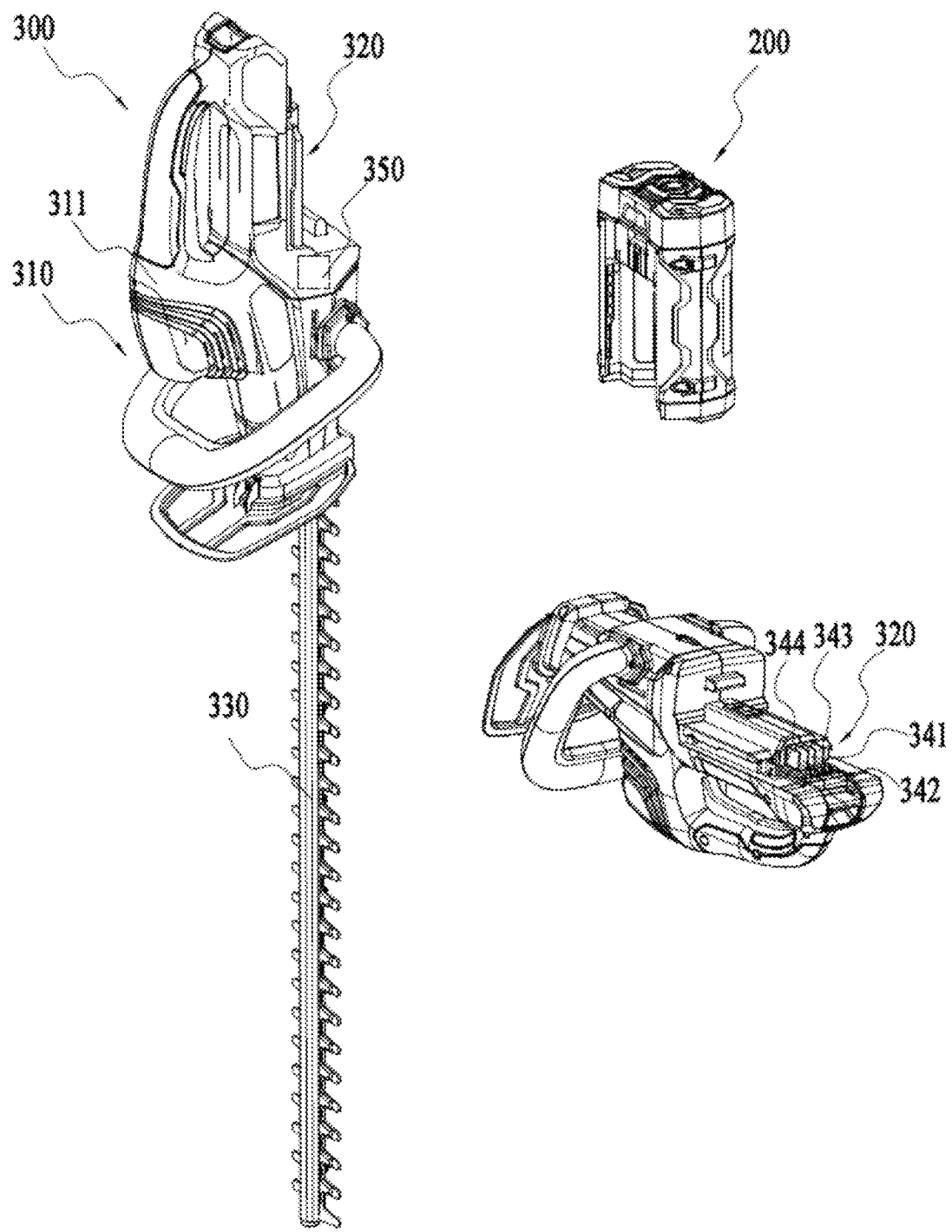
FIG. 4 is a structural diagram of a battery pack and the electrical device in a first example.

Referring to FIG. 4, in a first example, the electrical device is a power tool 300. The power tool 300 includes a main body 310 and a tool adapter interface 320. The tool adapter interface 320 is used to mount the battery pack 200 as described above.

The main body 310 includes a motor (not shown), a housing 311, and a tool member 330 for realizing a tool function, wherein the motor is disposed in the tool housing 311, and the tool member 330 is mounted at a front end of the tool body.

The tool adapter interface 320 is provided with a plurality of tool connection terminals for establishing electrical energy or/and signal transmission with the battery pack 200. The plurality of tool connection terminals include: a tool positive power terminal 343 and a tool negative power terminal 344, which are used to connect to the battery pack positive power terminal 233 and the battery pack negative power terminal 234 for transmitting electrical energy; a first tool terminal 341 for connecting to the first battery pack terminal 231 to transmit the first type of data; and a second tool terminal 342 for connecting to the second battery pack terminal 232 to transmit the second type of data.

Wherein, the first type of data includes data of the battery pack 200 such as voltage, discharge current, and battery cell voltage and/or data of the current operating state parameters of the power tool 300, such as load current to realize the normal operation and protection of the battery pack 200 and the power tool 300. The second type of data may be the operating parameters of the power tool 300, such as the usage frequency, the failure number, voltage, current, temperature, speed and torque of the power tool 300. The second type of data may alternatively be the data of the battery pack 200, such as SOC data and SOH data related to the current operating state of the battery pack, and history data or statistical data stored in the battery pack memory 246.

The power tool 300 also has a normal operation mode and a data transmission mode; in the normal operation mode, the battery pack 200 supplies power to the power tool through the tool connection terminals and the battery pack connection terminals, and the power tool 300 and the battery pack 200 transmit the first type of data for the normal operation of the battery pack 200 and the power tool 300 through the first tool terminal 341 and the first battery pack terminal 231; in the data transmission mode, the power tool 300 and the battery pack 200 transmit the second type of data for data analysis through the second tool terminal 342 and the second battery pack terminal 232.

The power tool 300 has identity information including whether the power tool 300 has a wireless communication module. After the normal operation mode ends, the first tool terminal 341 acquires the identity information of the power tool 300 through the first battery pack terminal 231.

In an example, the power tool 300 does not have a wireless communication module 350. After the normal operation mode ends, the first tool terminal 341 determines that the power tool 300 does not have a wireless communication module by the identity information of the power tool 300 acquired through the first battery pack terminal 231. Therefore, the battery pack controller 241 does not control the switching element to change the on-off state, the battery pack 200 and the power tool 300 cannot transmit the second type of data through the second battery pack terminal 232, and the battery pack 200 and the power tool 300 end the work.

In an example, the power tool 300 has a wireless communication module 350, and the first tool terminal 341 determines that the power tool 300 has a wireless communication module 350 by the identity information of the power tool 300 acquired through the first battery pack terminal 231. Therefore, the battery pack controller 241 controls the switching element to change the on-off state to switch the battery pack 200 to the data transmission mode, and the battery pack 200 can transmit the second type of data to the power tool through the second battery pack terminal 232. After the data transmission mode ends, the battery pack 200 and the power tool 300 end the work.

In other examples, considering that the battery pack 200 can also be mounted to other electrical devices such as the charger 400 and the portable power supply device 100 while the power tool 300 can only be used with the battery pack 200, when the power tool 300 does not have a wireless communication module, the power tool 300 can still transmit the second type of data of the power tool 300 through the second battery pack terminal 232. In the above manner, after the normal operation mode ends, the battery pack controller 241 of the battery pack 200 controls the switching element to change the conduction state, causing the battery pack 200 to switch to the data transmission mode. In this way, the battery pack 200 can collect not only its own data but also the data of the power tool 300. The data collection is more convenient, and the data of the power tool 300 and the battery pack 200 needs not be separately collected by other devices. Also, whether the power tool has a wireless communication module needs not to be worried in order to determine whether to transmit the second type of data. The data collection of the power tool 300 can also be realized while the power tool 300 needs not to provide a wireless communication module.

The battery pack 200 stores the second type of data acquired from the power tool 300 in the battery pack memory 246. Thus, when the battery pack 200 is mounted to the charger 400 or the portable power supply device 100, the second type of data of the battery pack 200 and the second type of data of the power tool 300 stored in the battery pack memory 246 can be transmitted through the second battery pack terminal 232 to the charger 400 or the portable power supply device 100 having a wireless communication module. Hereby, a wireless communication module may be provided only on the charger 400 or the portable power supply device 100, and the data of the charger 400 or the portable power supply device 100, the battery pack 200, and the power tool 300 can be transmitted to the external device through the wireless communication module, providing data support for research and development of the charger 400, the portable power supply device 100, the battery pack 200, and the power tool 300, and facilitating maintenance staff to perform fault diagnosis and fault repair, thereby saving manpower and material resources.

Figure 5:
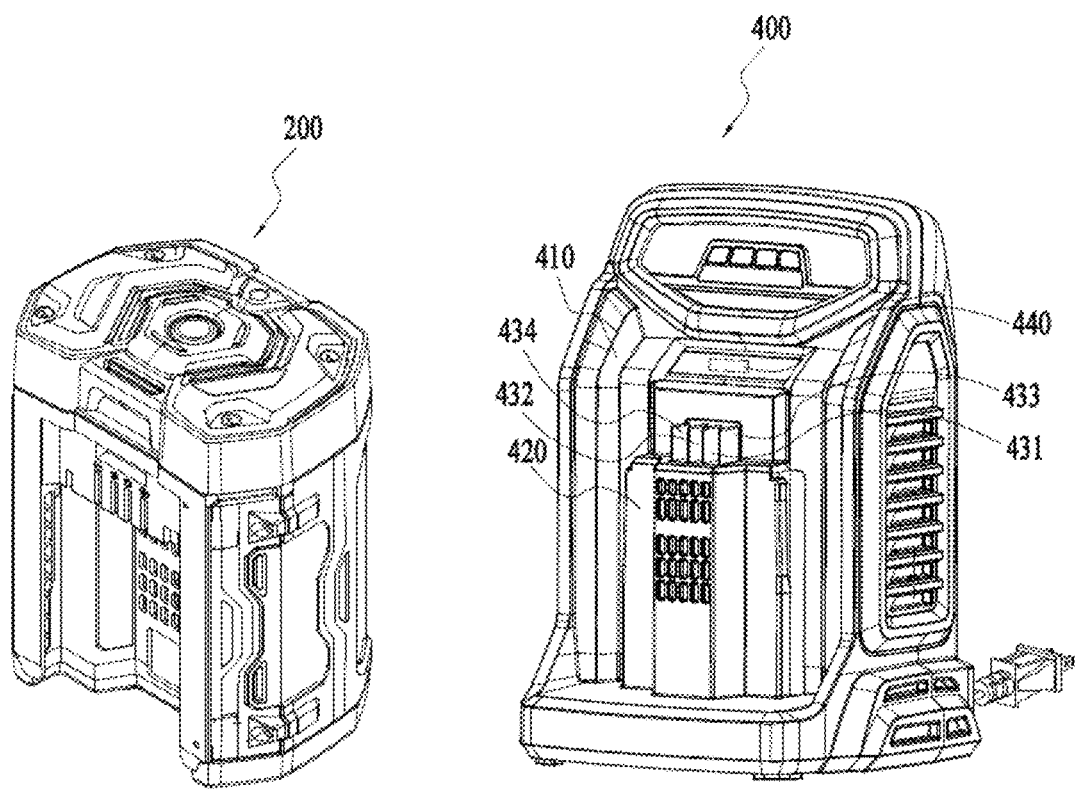
FIG. 5 is a structural diagram of a battery pack and an electrical device in a second example.

Referring to FIG. 5, in a second example, the electrical device is a charger 400, and the charger 400 includes a housing 410 and a charger adapter interface 420, and the charger adapter interface 420 is used for installing the battery pack 200. The charger adapter interface 420 is at least partially formed by the housing 410.

The charger 400 also includes a power conversion circuit (not shown in FIG. 5) for converting the incoming alternating current into a direct current capable of charging the battery pack 200. A power conversion circuit is disposed in the housing 410.

The charger adapter interface 420 is provided with a plurality of charger connection terminals for establishing power or/and signal transmission with the battery pack 100. The plurality of charger connection terminals includes: a charger positive power terminal 433 and a charger negative power terminal 434, which are respectively used connected to the battery pack positive power terminal 233 and the battery pack negative power terminal 234 to transmit electrical energy; a first charger terminal 431 configured to be connected to the first battery pack terminal 231 to transmit the first type of data; a second charger terminal 432 configured to be connected to the second battery pack terminal 232 to transmit the second type of data.

The first type of data may be the battery voltage, the charging current, the battery group voltage and the like of the battery pack 200 to implement normal operation of the battery pack 200 and the charger 400; the second type of data may be data for data analysis of the battery pack 200, for example, SOC data and SOH data related to the current operating state of the battery pack, and history data or statistical data stored in the battery pack memory 246, for example, the number of uses and the number of failures of the battery pack.

When the charger 400 is connected to the battery pack 200, the operation process of the battery pack 200 and the charger 400 is similar to that of the power tool 300 and the battery pack 200 in the first example, and is not described herein again, except that when there is no wireless communication module in the charger 400, the battery pack 200 does not switch to the data transmission mode after the normal operation mode ends, and the battery pack 200 cannot transmit the second type of data to the charger 400 through the second battery pack terminal 232.

Figure 6:
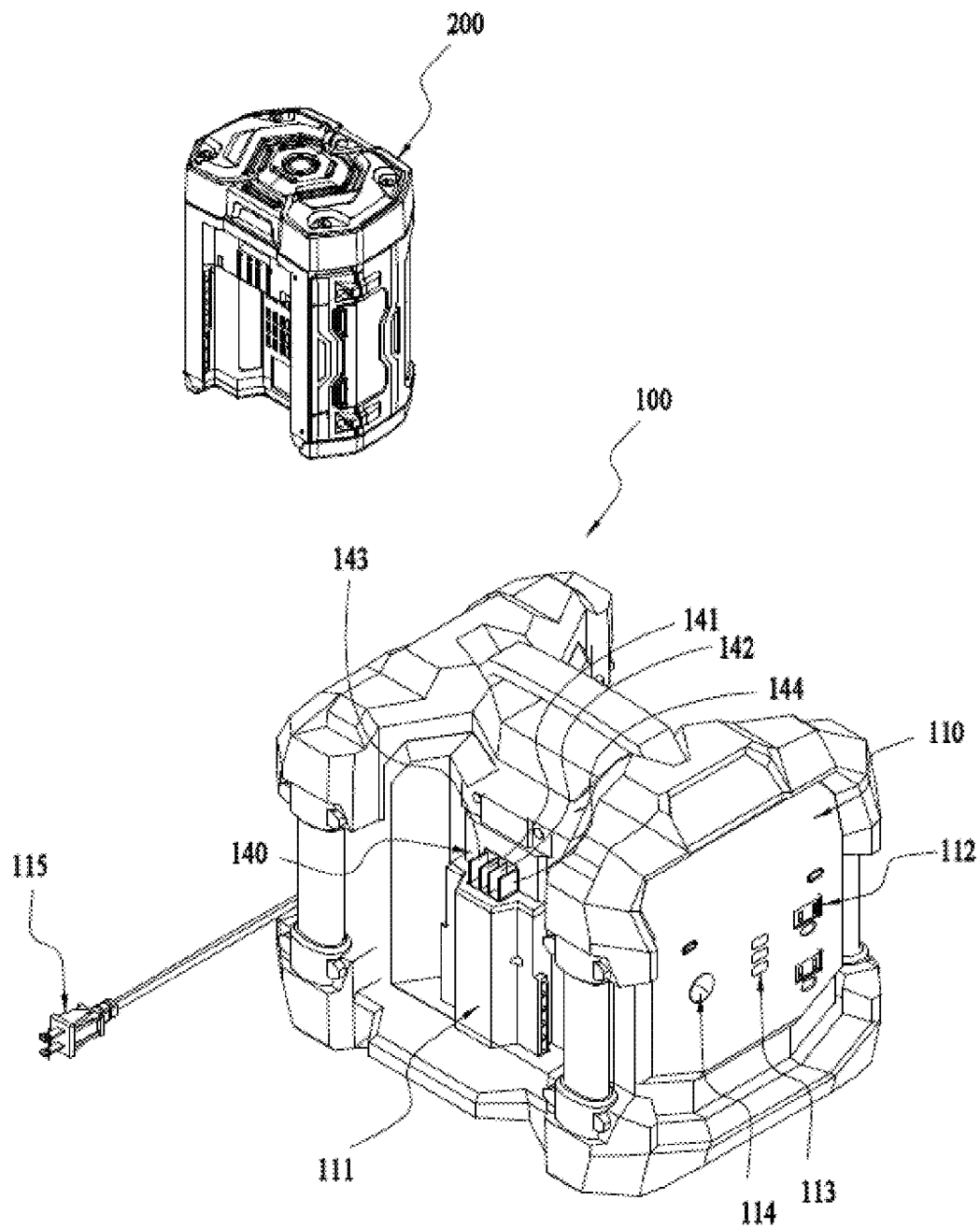
FIG. 6 is a structural diagram of a battery pack and an electrical device in a third example.

Referring to FIG. 6, in a third example, the electrical device is a portable power supply device 100, and the portable power supply device 100 includes an adapter 110 formed by a plurality of adapter interfaces 111 for mounting one or more battery packs 200. In some examples, the plurality of battery packs 200 may be detachably mounted to the adapter interface 111. In another example, the plurality of battery packs 200 may be fixedly mounted to the adapter interface 111. In other examples, the plurality of battery packs 200 may be at least partially detachably mounted to the adapter interface 111. The battery pack 200 mounted to the adapter interface 111 can obtain power from the adapter interface 111, and can also output power through the adapter interface 111. A connection terminal 140 is provided in the adapter interface 111 for connection with a connection terminal of the battery pack 200. The battery pack 200 can provide electrical power to a power tool 300, including hand-held power tool and garden power tool.

The portable power supply device 100 further includes a main control module 132 for controlling the operation process of the entire portable power supply device 100, for example, opening and closing of the portable power supply device 100, the status display, etc., and the main control module 132 may specifically include a controller, the controller may be some control signal chip (for example, a single chip microcomputer); a charge and discharge management module 133 connected to the connection terminals of the main control module 132 and the adapter interface 111 for managing the charging process or discharging process of the battery pack 200 connected to the adapter interface 111. The charge and discharge management module 133 may specifically include a charging circuit, a discharging circuit, and a controller, wherein the charging circuit is electrically connected between the adapter interface 111 and the controller for charging the battery pack 200 connected to the portable power supply device 100; the discharge circuit is electrically connected between the adapter interface 111 and the controller of the portable power supply device 100 for discharging the battery pack 200 connected to the portable power supply device 100. The controller of the charge and discharge management module 133 may be some control signal chip (for example, a single chip microcomputer), and the charging circuit and the discharge circuit are well known to those skilled in the art, and are not described herein again.

The portable power supply device 100 further includes an inverter circuit and a rectifier circuit. The inverter circuit can convert the DC power outputted by the battery pack 200 connected to the adapter interface 111 into AC power; the rectifier circuit can convert the AC power connected to the adapter 110 into DC power that can charge the battery pack 200. The inverter circuit and the rectifier circuit are each composed of corresponding circuit board and circuit components, and the circuit board and circuit components constituting the inverter circuit and the rectifier circuit are accommodated in a cavity formed by the housing of the portable power supply device 100. In this example, the charging circuit includes a rectifying circuit for converting the input alternating current into a direct current capable of charging the battery pack 200. The discharging circuit includes an inverter circuit for converting the direct current output by the battery pack 200 connected to the adapter interface 111 into an alternating current.

Adapter 110 also includes an AC input interface that enables the adapter 110 to be connected to the AC power in the grid. Specifically, the AC input interface can be constructed as a power plug 115 as shown in FIG. 6. The adapter 110 can charge the connected battery pack 200 through the input alternating current; in a specific example, the AC input interface is electrically connected to the rectifier, so that the alternating current input from the AC input interface is converted to the direct current that the battery pack 200 is charged with.

The adapter 110 also includes an AC output interface that can be used to output AC power to enable the portable power supply device 100 to function as an AC power source. In a specific example, the power source of the AC output interface may be the power stored in the battery pack 200 to which the adapter 110 is connected, or the power of the AC grid introduced by the adapter 110 from the AC input interface. The AC output interface can be constructed in the form of a power outlet 112 as shown in FIG. 6, enabling the portable power supply device 100 to power a common AC powered device.

The adapter 110 can use the power of the battery pack 200 to which it is connected and output the alternating current through the AC output interface. In a specific example, the AC output interface is at least electrically connected to the inverter. The direct current from the battery pack 200 is converted to an alternating current through the inverter and then output to the AC output interface.

The adapter 110 also includes a DC output interface to enable the adapter 110 to output direct current. Specifically, the DC output interface may be configured as a 5V USB interface 113 as shown in FIG. 6, or may be configured as a 12V vehicle power interface 114 as shown in FIG. 6; of course, the DC output interface can also be constructed in other forms and output other voltages such as 19V, 36V. In a specific example, the power source of the DC output interface may be the power stored in the battery pack 200 to which the adapter 110 is connected, or the DC power of other devices introduced by the adapter 110 from the DC input interface, such as the electrical energy stored in the storage battery of an automobile.

The adapter 110 can also include a DC input interface for connecting the adapter 110 to DC power. The adapter 110 can charge the battery pack 200 from the direct current that is external to its battery pack 200, and can also be used by other electrical devices. For example, the user can make use of the battery of the automobile through the DC input interface to charge the battery pack 200 connected to the adapter 110. Of course, the user can also use the DC output interface of the adapter 110 to charge the battery of the automobile to solve the problem that the automobile cannot be started due to emptied storage battery. The DC input interface can also be constructed as a USB interface 114 or a 12V interface 115 as shown in FIG. 6.

The adapter interface 111 of the portable power supply device 100 can be adapted to a plurality of battery packs 200, which can be either the battery packs 200 having the same rated voltage or the battery packs 200 having different rated voltages; the charging circuit of the portable power supply device 100 can make one of the battery packs 200 having a higher voltage or/and capacity charge another battery pack 200 having a lower voltage or/and capacity; of course, the portable power supply device 100 can also incorporate its internal circuitry (for example, a booster circuit) to make the battery pack 200 having a lower voltage or/and capacity charge the battery pack 200 having a higher voltage or/and capacity.

The plurality of connection terminals provided in the adapter interface 111 of the portable power supply device 100 include a positive power connection terminal 143, a negative power connection terminal 144, a first connection terminal 141, and a second connection terminal 142.

The positive power connection terminal 143 and the negative power connection terminal 144 of the portable power supply device 100 are respectively connected to the battery pack positive power terminal and the battery pack negative power terminal of the battery pack to transmit electric energy. The first connection terminal 141 is for connecting with the first battery pack terminal 231 to transmit the first type of data; the second connection terminal 142 is for connecting with the second battery pack terminal 232 to transmit the second type of data.

Wherein, the first type of data is data for normal operation when the portable power supply device 100 and the battery pack 200 are used together. For example, when the portable power supply device 100 charges or discharges the battery pack 200 mounted on the adapter interface 111, the temperature, current, voltage, and the like of the battery pack are collected to ensure the normal operation and protection of the portable power supply device 100 and the battery pack 200.

The second type of data is data for data analysis, for example, the operating parameters of the battery pack 200 and the power tool 300 stored in the memory of the battery pack 200, including the fault information, the number of uses, the voltage, the current, the actual capacity of the battery pack 200, the usage frequency, the number of faults, the voltage, the current, the temperature, the speed, and the torque of the power tool 300. The second type of data not only provides data support for research and development, but also facilitates maintenance staff to carry out fault diagnosis and fault repair for the battery packs 200 and the power tool 300, saving manpower and material resources.

In the present example, the portable power supply device 100 has a normal operation mode and a data transmission mode; in the normal operation mode, the portable power supply device 100 charges the battery pack 200 or discharges the battery pack 200 through the connection terminal in the adapter interface 111. The portable power supply device 100 and the battery pack 200 transmit the first type of data when the portable power supply device 100 and the battery pack 200 are used for normal operation through the first connection terminal 141 and the first battery pack terminal 231; in the data transmission mode, the portable power supply device 100 and the battery pack 200 transmit the second type of data for data analysis of the battery pack 200 and/or the power tool 300 through the second connection terminal 142 and the second battery pack terminal 232. In the present example, the battery pack 200 includes a battery pack memory 246 for storing data of the battery pack 200 and data of the power tool 300. The battery pack 200 and the power tool 300 do not include a wireless communication module.

By providing two sets of connection terminals for transmitting data, it is possible to ensure the normal operation of the portable power supply device 100 interfaced with the battery pack 200, as well as the data acquisition from the portable power supply device 100 and/or the battery pack 200 and/or power tool 300, providing data support for research and development of the portable power supply device 100 and/or the battery pack 200 and/or the power tool 300, and facilitating maintenance staff to carry out fault diagnosis and fault repair of the portable power supply device and/or the battery pack and/or the power tool, saving manpower and material resources.

In an example, the portable power supply device 100 further includes a communication device 120. The communication device 120 includes a wireless communication module 121 for establishing a wireless communication connection between the portable power supply device 100 and an external device. The portable power supply device 100 can transmit data to or receive data from an external device through the wireless communication module. In a specific example, the wireless communication module 121 of the portable power supply device 100 may be a wireless router of a local area network, which may directly access the Internet to enable other wireless communication devices in the local area network to access the Internet, and may also connect to a wireless communication device capable of accessing the Internet to enable other wireless communication devices in the local area network to access the Internet. Of course, the wireless communication device may also only enable data communication among the wireless communication devices within the local area network. The wireless communication device may realize wireless communication by means of Bluetooth, WiFi, NFC, ZigBee, and the like.

Thus, the second type of data transmitted between the portable power supply device 100 and the battery pack 200 can be transmitted to the external device through the wireless communication module 121. The external device has data processing and analysis functions, and thus the data transmitted to the external device through the wireless communication module provides data support for research and development of the portable power supply device 100 and/or the battery pack 200 and/or the power tool 300, and facilitates maintenance staff to perform fault diagnosis and fault repair of the power supply device and/or the battery pack and/or the power tool, thereby saving manpower and material resources.

Figure 8:
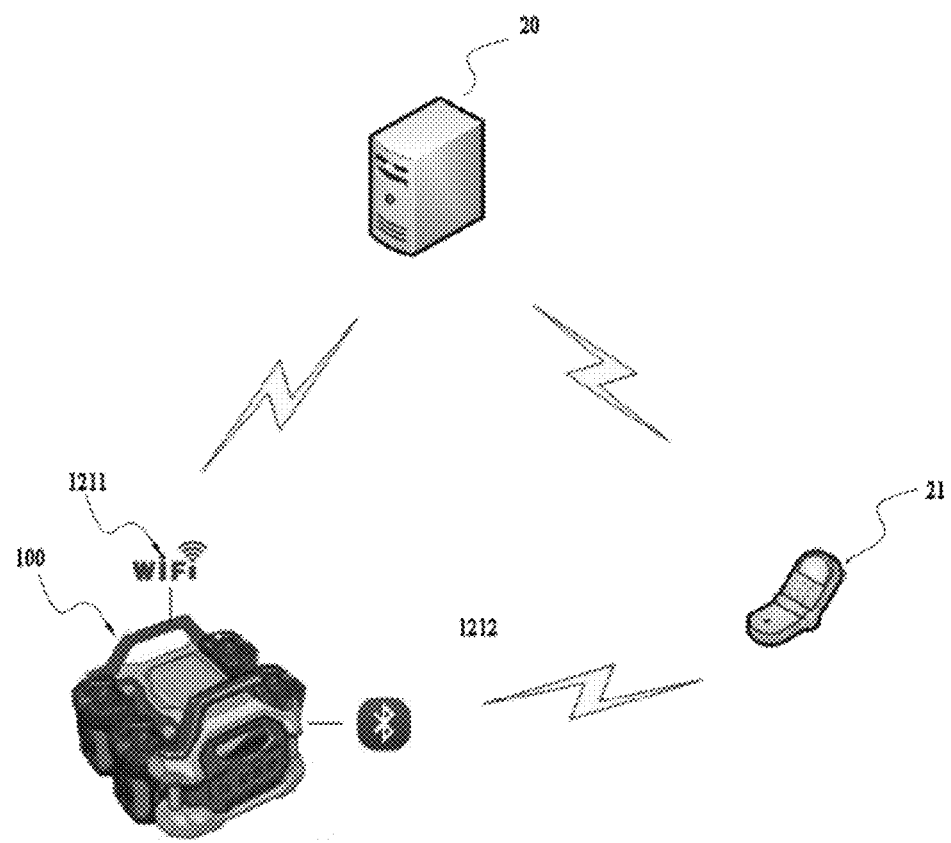
FIG. 8 is an information exchange network diagram between an electrical device and an external device according to the third example.

Referring to FIG. 8, the external devices include a remote server 20 having data processing and analysis functions, and the remote server includes a wireless communication module, and the portable power supply device 100 and the remote server 20 transmit data through respective wireless communication modules. Of course, the external device can also transmit data (for example, an upgrade program) and instructions (for example, a boot instruction) to the portable power supply device 100 through the wireless communication module.

The external devices may further include a mobile terminal device 21 having a data transmitting and receiving function; the mobile terminal device including a wireless communication module, the mobile terminal device 21, the portable power supply device 100, and the remote server 20 transmit data through respective wireless communication modules. In this way, the mobile terminal can transmit instructions or data to the electrical device through the wireless communication module, and can also receive data of the electrical device. The mobile terminal device 21 includes a display module capable of displaying information transmitted from the portable power supply device 100, including the current state of the portable power supply device 100, such as the remaining power and the remaining time of the portable power supply device 100, which is convenient for the user to check and determine whether to charge or discharge the battery pack, and whether to end the work in progress to save electric power.

In the present example, the external devices include the remote server 20 and the mobile terminal device 21. The mobile terminal device 21 has a receiving and transmitting function, and includes a wireless communication module for performing data transmission and reception. The mobile terminal device 21 may be an electronic device such as a mobile phone, a dedicated handheld device, or a tablet computer. The remote server 20 has data processing and analysis functions, and includes a wireless communication module. The portable power supply device 100, the remote server 20, and the mobile terminal device 21 transmit data through respective wireless communication modules.

In this way, the portable power supply device 100 can transmit the collected data to the remote server 20 through the wireless communication module 121 for data processing and analysis, provide support for research and development and fault diagnosis, or transmit the collected data to the mobile terminal device 21 for the user to check the situation of the portable power supply device 100 or the battery pack 200 or the power tool 300 to arrange the next job, for example, determine whether the number of failures of the power tool 300 has reached the upper limit to need repair, and whether the temperature of the battery pack 200 has reached the upper limit to pause discharging, and whether the portable power supply device 100 needs to pause output during outdoor work or travel to ensure sufficient power for return.

The portable power supply device 100 further includes identity information, and the first battery pack terminal 231 is further configured to acquire identity information of the portable power supply device 100 through the first connection terminal 141, the identity information including whether the portable power supply device 100 has the wireless communication module 121 described above. Thereby, the first battery pack terminal 231 can not only transmit the first type of data for the portable power supply device 100 and the battery pack 200 for normal operation, but also detect whether the portable power supply device has the wireless communication module 121, realizing two functions with one terminal to reduce the number of terminals used.

In some specific examples, the identity information may be a serial number stored in the memory of the portable power supply device 100, and the memory may be located in the charge and discharge management module 133, and the memory is further capable of storing the data of the portable power supply device 100 and the data of the battery pack 200 and/or the power tool 300 that the battery pack transmits through the second connection terminal 142 and the second battery pack terminal 232. This has the advantage that the data of the battery pack 200 and the power tool 300 can be collected by the portable power supply device 100 without separately collecting the data of the battery pack 200 and the power tool 300 through other devices (such as the diagnostic device, the wireless communication module of the battery pack 200 and the power tool 300), which makes the data collection process simpler and cheaper.

The serial number is the device model of the portable power supply device 100, and the battery pack 200 can read the serial number through the first battery pack terminal 231 to determine whether the portable power supply device 100 has the wireless communication module 231; in other specific examples, the resistance value of an identification resistor can be used to represent the identity information of the portable power supply device 100. The identification resistor is connected to the first connection terminal 141. The battery pack 200 can measure the voltage of the identification resistor through the connection of the first battery pack terminal 231 and the first connection terminal 141, thereby obtaining the resistance value of the identification resistor based on the voltage, thereby determining whether the portable power supply device 100 has the wireless communication module 121.

In the present example, the battery pack controller 241 is configured to: determine whether the portable power supply device 100 has the wireless communication module 121 according to the identity information of the portable power supply device 100 acquired by the first battery pack terminal 231; and after determining that the portable power supply device 100 has the wireless communication module 231, the second type of data is transmitted between the second connection terminal 142 and the second battery pack terminal 232. The battery pack controller 241 may be a chip having a control function such as a single chip microcomputer.

Only when the portable power supply device 100 has the wireless communication module 121, can the second type of data be transmitted between the second connection terminal 142 and the second battery pack terminal 232, the advantage being to avoid the situation when the portable power supply device 100 does not have the wireless communication module 121 and yet the battery pack 200 still transmits the second type of data for data analysis of the battery pack 200 and/or the power tool 100 to the portable power supply device 100 through the second connection terminal 142 and the second battery pack terminal 232, causing the second type of data to take up the memory space of the portable power supply device 100 in addition to not transmitted to the external device through the portable power supply device 100. Only when the portable power supply device 100 has the wireless communication module 121, can the second type of data be transmitted between the second connection terminal 142 and the second battery pack terminal 232, enabling timely transmit of the data of the portable power supply device 100 and/or the battery pack 200 and/or the power tool 300 to the external device through the wireless communication module 120 for data processing and analysis.

In addition, the portable power supply device 100 collects data of the portable power supply device 100, the battery pack, and the power tool, and then transmits the collected data to the external device through the wireless communication module 121 of the portable power supply device 100, without separately collecting the data of the portable power supply device 100, the battery pack 200 and the power tool 300 through other devices, the data collection process is simpler and the cost is lower.

In an example, after the normal operation mode ends, the first battery pack terminal 231 can acquire the identity information of the portable power supply device 100 through the first connection terminal 141. This has the advantage that after the normal operation mode ends, that is, after the portable power supply device 100 completes charging or discharging the battery pack 200, the first battery pack terminal 231 acquires the identity information of the portable power supply device 100 through the first connection terminal 141. Entering the data transmission mode if the portable power supply device 100 has the wireless communication module 121 can avoid switching to the data transmission mode suddenly when the normal operation mode has not ended, which causes system disorder and affects the normal operation of the battery pack 200 and the portable power source, thereby damaging the battery pack and portable power supply device 100, as well as the reliability of the transmitted data. And after the normal operation mode ends, if the portable power supply device 100 has the wireless communication module 121, the data of the portable power supply device 100 and/or the battery pack 200 and/or the power tool 300 can be sent out through the wireless communication module 121 in time to avoid long time occupation of the memory.

Figure 7:
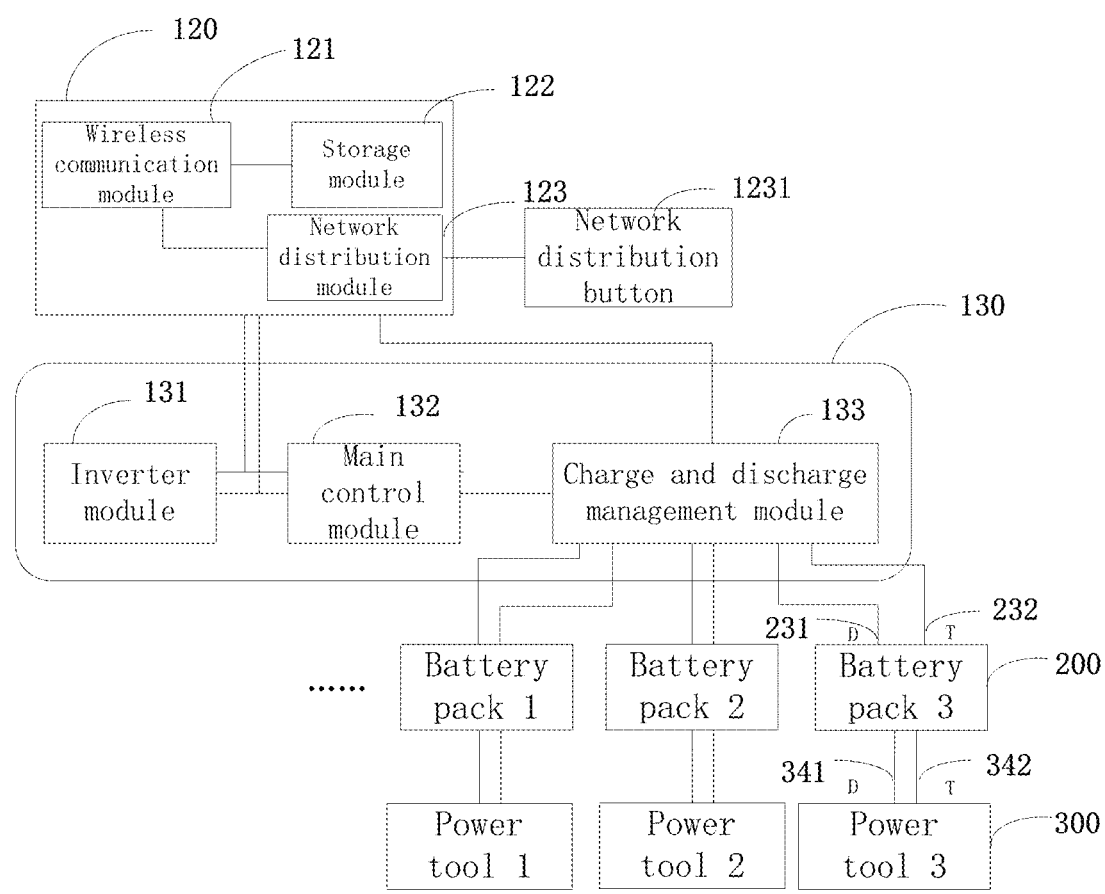
FIG. 7 is a schematic diagram depicting the connection of an electrical device, a battery pack, and a power tool in the third example.

Referring to FIG. 7, the present disclosure also provides a portable power source system including the portable power supply device 100, a plurality of battery packs 200, and a power tool 300 adapted to the respective battery packs 200. Referring to the connection schematic of the portable power source system depicted in FIG. 7, the portable power supply device 100 can be connected to the battery pack 200, and the battery pack 200 can be connected to the portable power supply device 100 and the power tool 300.

The battery pack is the battery pack 200 as described before, and the power tool 300 is the electric power tool 300 as described before.

When the battery pack 200 is mounted to the power tool 300, in the normal operation mode, the battery pack 200 discharges to the power tool 200 through the connection terminal, and the first type of data for the normal operation of the battery pack 200 and the power tool 300 is transmitted between the first battery pack terminal 231 and the first tool terminal 341, including the voltage, temperature, discharge current of the battery pack 200, and the load current, stop discharge signal of the power tool 300 to realize the normal operation of the battery pack 200 and the power tool 300 and to protect the battery pack 200 and the power tool 300.

When the battery pack 200 is mounted to the power tool 300, in the data transmission mode, the power tool 300 transmits the second type of data for data analysis to the battery pack 200 through the second tool terminal 342 and the second battery pack terminal 232. The second type of data is the operating parameters of the power tool 300, such as the frequency of use of the power tool 300, the number of failures, voltage, current, temperature, speed, torque, and the like. In the present example, the power tool 300 does not have a wireless communication module.

In an example, when the battery pack 200 is mounted to the power tool 300, it first operates in the normal operation mode, and the first battery pack terminal 231 and the first tool terminal 341 transmit the first type of data for normal operation of the battery pack 200 and the power tool 300. When the normal operation mode ends, the battery pack 200 and the power tool 300 are directly switched to the data transmission mode, and the power tool 300 sends the data of the power tool 300 to the battery pack 100 through the second tool terminal 342 and the second battery pack terminal 232, such as the frequency of use, the number of failures, voltage, current, temperature, speed, and torque of the power tool 300. In the present example, the battery pack 200 does not need to detect whether the power tool 300 has a wireless communication module, and the wireless communication module provided on the power tool does not need to transmit the second type of data to the external device. Instead, the battery pack 200 collects the second type of data of the power tool 300 through the battery pack 200. After the battery pack 200 is mounted to the portable power supply device 100, the battery pack 200 transmits the collected second type of data to the portable power supply device 100 through the second battery pack terminal 232, and to the external device through the wireless communication module 121 of the portable power supply device 100. This saves the wireless communication module on the power tool 300, reduces the cost, collects more concentrated data and facilitates data processing.

The battery pack memory 246 of the battery pack 200 is used for storing the data of the battery pack 200 and data of the power tool 300. When the battery pack 200 is mounted to the portable power supply device 100, in the data transmission mode, the battery pack 200 transmits the second type of data for data analysis stored in the memory of the battery pack 200 to the portable power supply device 100 through the second battery pack terminal 232. The second type of data includes data of the battery pack and the power tool.

In this way, the battery pack 200 can collect not only its own data but also the data of the power tool 300, and the data collection is more convenient, and it is not necessary to separately collect data of the power tool 300 and the battery pack 200 through other devices.

Alternatively, the power tool 300 has a memory for storing parameter data of the power tool 300 including data such as frequency of use, number of failures, voltage, current, temperature, speed, torque, and the like. The battery pack 200 is capable of acquiring the data stored in the memory of the power tool 300 through the second battery pack terminal 232.

With continued reference to FIG. 7, the portable power supply device 100 includes a communication device 120, a main control module 132, an inverter module 131, and a charge and discharge management module 133. Wherein the charge and discharge management module 133 is configured to manage the charging and discharging process of the battery pack 200, including coordination of the charging and discharging order of each battery pack. The charge and discharge management module 133 includes a data memory for storing data of the portable power supply device 100, the battery pack 200, and the power tool 300.

The communication device 120 includes a wireless communication module 121 for wirelessly communicating with an external device (such as the remote server 20, the mobile terminal device 21, etc.). The communication device 120 may be a universal module with a unified interface or protocol that can be applied to different types of devices. The communication device 120 has any one or more of the communication functions of BLE, WIFI, zigbee, and cellular mobile data communication. The communication device 120 may alternatively be a specialized module that implements any one or more of the communication functions of BLE, WIFI, zigbee, and cellular mobile data communication, but does not have a unified interface or protocol. The communication device 120 may also be a cellular-based Narrow Band Internet of Things (hereinafter referred to as "NB-IOT"), which is built on a cellular network and can be directly deployed on a GSM network, a UMTS network or an LTE network. No configuration is required to directly connect to the network, directly access the remote server 20 or the mobile terminal device 21, and the communication can be realized as long as there is signal coverage. In this way, the NB-IOT can realize data collection, condition monitoring, and program update operations of the power tool 300, the battery pack 200, and the portable power supply device 100 through cellular mobile communication.

In an example, the communication device 120 further includes a network distribution module 123 for selecting the communication method (for example, Bluetooth or WIFI mode) to communicate with an external device. The network distribution module may include a network distribution button 1231 for the user to select one of the communication modes through the network distribution button 1231 to establish a communication connection with the external device. The user can also directly guide the network distribution process with the mobile application, and the network distribution process also employs user binding so that no rebinding is needed. For example, the communication device 120 includes a Bluetooth module 1212 and a WIFI module 1211. When the user sets the communication device 120 to communicate in the WIFI mode with the mobile phone application, the control privileges of the portable power supply device through the Bluetooth mode can be automatically obtained. When the user sets the communication device 120 to communicate in the Bluetooth method with the mobile phone application, the control privileges of the portable power supply device through the WIFI mode can be automatically obtained.

In an example, the network distribution process and the identity verification process by the WIFI method include the following steps: long press the network distribution button for a few seconds, the portable power supply device 100 enters the configuration mode; the user accesses the application of the mobile terminal device 21 having the network communication function through a mobile phone or the like and clicks on the WIFI to add device; the portable power supply device 100 is connected to the router and automatically registers on the remote server 20; the mobile terminal device 21 and the portable power supply device 100 are in the same local area network, and the user requests identity information of the portable power supply device 100 from the portable power supply device 100 through the application program on the mobile terminal device 21, and binds the user mobile terminal device 21 and the portable power supply device 100 through the identity information. At this time, the portable power supply device 100 is already in the device list in the application of the user mobile terminal device 21.

The communication device 120 may further include a storage module 122 for storing data information sent by the external device (for example, an upgrade file) and data information sent by the internal module of the portable power supply device 100 (for example, the state data of the portable power supply device 100, the battery pack 200, and the power tool 300). The communication device may further include a verification module for verifying whether the received data information is correct.

The communication device 120 is electrically connected to the main control module 132 of the portable power supply device 100. The main control module 132 receives an instruction from an external device sent by the wireless communication module of the communication device 120, and manages the normal operation of the entire portable power supply device 100. The charge and discharge management module 133 is connected to the connection terminals in the main control module 132 and the adapter interface 111 to manage the charging process or the discharging process of the battery pack 200 connected to the adapter interface 111, and collect data and transmit the collected data to the external device through the wireless communication module 121 of the communication device 120. The inverter module 131 is electrically connected to the main control module 132, and is under the management of the main control module 132 in the operation mode, and is connected to the communication device 120 in parallel to the main control module 132 through the bus in the upgrade mode. The inverter module 131 receives the upgrade scheduling management of the communication device 120 to complete the program upgrades. The inverter module 131 includes an inverter for converting the received DC power into AC power output.

The battery pack 200 can be adapted to the adapter interface 111 of the portable power supply device 100 to be electrically connected to the charge and discharge management of the portable power supply device 100 through the battery pack connection terminal and the connection terminal in the adapter interface 111 on the portable power supply device 100. In the module 133, the battery pack 200 is connected to the charging/discharging management module 133 of the portable power supply device 100 by the connection of the battery pack connection terminal to the connection terminal of the portable power supply device. The battery pack includes a battery pack positive power terminal 233, a battery pack negative power terminal 234, a first battery pack terminal 231 and a second battery pack terminal 232, and a controller (not shown).

The portable power supply device 100 has a positive power connection terminal 143, a negative power source connection terminal 144, a first connection terminal 141, and a second connection terminal 142, wherein the positive power connection terminal 143 and the negative power source connection terminal 144 are respectively used to connect to the battery pack positive power terminal 233 and the battery pack negative power terminal 244 for transmitting electrical energy; the first connection terminal 141 is for connecting with the first battery pack terminal 231 to transmit the first type of data; and the second connection terminal 142 is for connecting with the second battery pack terminal 232 to transmit the second type of data. When the battery pack is connected to the portable power supply device 100, the battery pack 200 and the portable power supply device 100 realize the transmission of the first type of data through the connection of the first connection terminal 141 and the first battery pack terminal 231, and the transmission of the second type of data through the connection of the second connection terminal 142 and the second battery pack terminal 232.

The portable power supply device 100 has a normal operation mode and a data transmission mode. In the normal operation mode, the portable power supply device 100 transmit the first type data for the normal operation of the portable power supply device 100 and the battery pack 200 through the first connection terminal 141 and the first battery pack terminal 231. In the data transmission mode, the power supply device 100 and the battery pack 200 transmit the second type of data for data analysis of the battery pack 200 and/or the power tool 300 through the second connection terminal 142 and the second battery pack terminal 232.

Wherein, the first type of data is data for normal operation when the portable power supply device 100 and the battery pack 200 are used together. For example, when the portable power supply device 100 charges or discharges the battery pack 200 mounted on the adapter interface 111, the temperature, current, voltage, and the like of the battery pack are collected to ensure the normal operation and protection of the portable power supply device 100 and the battery pack 200. The second type of data is data for data analysis, for example, the operating parameters of the battery pack 200 and the power tool 300 stored in the memory of the battery pack 200, including the fault information, the number of uses, the voltage, the current, the actual capacity of the battery pack 200, the usage frequency, the number of faults, the voltage, the current, the temperature, the speed, and the torque of the power tool 300. The second type of data not only provides data support for research and development, but also facilitates maintenance staff to carry out fault diagnosis and fault repair for the battery packs 200 and the power tool 300, saving manpower and material resources.

The portable power supply device 100 has identity information, and the first battery pack terminal 231 is further configured to acquire identity information of the portable power supply device 100 through the first connection terminal 141, the identity information including whether the portable power supply device 100 has the wireless communication module 121, in the present example, the portable power supply device 100 has a wireless communication module 121. In an example, after the normal operation mode ends, the first battery pack terminal 231 can acquire the identity information of the portable power supply device 100 through the first connection terminal 141.

Specifically, after the battery pack 200 is mounted to the adapter interface 111 of the portable power supply device 100, the portable power supply device 100 first operates in a normal operation mode, and after the normal operation mode ends, the first battery pack terminal 231 obtains the identity information of the portable power supply device 100 through the first connection terminal 141, and determines that the portable power supply device 100 has the wireless communication module 121, then the controller controls the battery pack 200 to switch to the data transmission mode to transmit the second type of data between the second connection terminal 142 and the second battery pack terminal 232.

In the portable power source system described above, the battery pack 200 is capable of collecting its own data and the data of the power tool 300, the portable power supply device 100 is capable of collecting its own data, the data of the battery pack 200, and the data of the power tool 300 stored in the battery pack 200. The portable power supply device 100 transmits the collected data of itself, the data of the battery pack 200, and the data of the power tool 300 to the external device through the wireless communication module 121 for data processing and analysis.

In order to facilitate the analysis and processing of the received data by the remote server 20, the data of the portable power supply device 100, the battery pack 200, and the power tool 300 uploaded by the portable power supply device 100 are categorized into three types: real-time data, statistical data, and history data. The data is respectively stored in specified memory partitions of the data storage of the charge and discharge management module 133 according to different types of history data, statistical data, and real-time data. When the specified partition is used up, the original data will be overwritten by the current data. This scrolling storage method saves the latest data and saves the storage space.

Specifically, the real-time data of the power tool 300 includes operating parameters during operation of the power tool 300, such as real-time current, real-time voltage, real-time temperature, real-time torque, etc. The statistical data of the power tool 300 includes accumulated working time, number of failures, and the like. The real-time data of the battery pack 200 includes the total voltage of the battery pack 200, the temperature of the battery pack 200, the minimum cell voltage, the operating state of the battery pack, etc. The statistical data of the battery pack 200 includes the cumulative time of charge and discharge, the number of charge and discharge, and the number of over temperature during charge and discharge, the remaining capacity, the temperature distribution of the charging and discharging process, etc. The history data of the battery pack 200 includes the battery pack failure state, the battery pack temperature, the battery pack voltage, the battery pack charge and discharge current, the single cell voltage, and the like. The real time data of the portable power supply device 100 includes output current, output power, charge or discharge state for each battery pack, charge or discharge current/voltage for each battery pack, networked state, and the like. The history data of the portable power supply device 100, the battery pack 200, and the power tool 300 are historical work data stored in the respective memories of the portable power supply device 100, the battery pack 200, and the power tool 300.

In order to distinguish data of different products, device identity information may be added or associated with the above three types of devices in order to track the full life cycle state of the product. In some examples, the device identity information is a unique identifier. In the present example, the devices include the portable power supply device 100, the battery pack 200, and the power tool 300.

Since the data is divided into real-time data, statistical data, and history data with time attributes, it is necessary to add or associate time information to the above data. In other words, at least one of the above three types of data, real-time data, statistical data, and history data contains time information, and such data with time information is necessary for big data analysis later. Due to the inconsistency of time in various regions and countries of the world, in order to ensure the time synchronization or time consistency for data in various regions, the time in the data is measured in UTC. Each product or device acquires world standard time from an external device with world standard time information. For example, in the portable power system, the world standard time can be acquired by the wireless communication module 121 of the communication device 120 from the remote server 20 or the mobile terminal device 21, and then requested by the charge and discharge management module 133 of the portable power supply device 100 from the communication device 120 to calibrate its own time information. When the battery pack 200 is mounted to the adapter interface 111 of the portable power supply device 100, the battery pack 200 may request the standard time from the charge and discharge management module 133. When the battery pack 200 is connected to the power tool 300, the power tool 300 may request the standard time from the battery pack 200, and pass the standard time step by step in this way. In this way, the data generated by the portable power supply device 100, the battery pack 200, and the power tool 300 can maintain the time synchronization or time consistency of the data information in various regions, which facilitates unified management.

One example of the data acquisition process of the portable power system is described in detail below.

The battery pack 200 is interfaced with the power tool 300. After the switch of the power tool 300 is triggered, the power tool 300 sends a time request to the battery pack 200 to obtain the current standard time information of the battery pack 200 for recording and processing the data information of the power tool 300. The battery pack 200 replies the standard time information to the power tool 300; after receiving the standard time, the power tool 300 calibrates its own time and returns time calibration confirmation information to the battery pack 200; after the switch of the power tool 300 is released, and before the removal of the battery pack 200 or before the power tool 300 is powered off, the power tool 300 transmits the data stored in its own memory to the battery pack 200; the battery pack 200 receives the data from the power tool 300 and stores it in its own memory.

Specifically, the memory of the battery pack 200 can be divided into an index partition, a statistical data partition of the power tool 300, a statistical data partition of the battery pack 200, and a history data partition. The above memory partitions can be divided into two types of storage forms, one is stable storage, and the other one is rolling storage, that is, after the specified partition is used up, the new data covers the old data. This method of data storage can also be extended to the portable power supply device 100, the power tool 300, and the remote server 20.

The information sent by the battery pack 200 to the power tool 300 and the information sent by the power tool 300 to the battery pack 200 include respective identity information of the battery pack 200 and the power tool 300, and the data information sent by the power tool 300 to the battery pack 200 includes the time information of the world standard time. The battery pack 200 communicates with the power tool 300 through the second battery pack terminal 232 and the second tool terminal 342, and may adopt a serial communication method.

When the battery pack 200 is removed from the power tool 300 and interfaced with the portable power supply device 100 for charging or discharging, the battery pack 200 transmits time request information to the portable power supply device 100, and the portable power supply device 100 replies its own standard time to the battery pack 200. After receiving the standard time, the battery pack 200 calibrates its own time and feeds back the time calibration confirmation information to the portable power supply device 100; the portable power supply device 100 polls the real-time data, statistical data, history data of the battery pack 200, and/or the data information of the power tool 300 stored in the memory of the of the battery pack 200; the battery pack 200 transmits corresponding real-time, statistical or history data to the portable power supply device 100 in accordance with instructions from the portable power supply device 100.

The charge and discharge management module 133 retrieves the statistical data of each battery pack in a fixed order when interfaced with the battery packs, and collects the statistics data of one battery pack and then retrieves the next battery pack until the statistics data of every battery pack is retrieved. The charge and discharge management module 133 can start to retrieve the history data of each battery pack 200 in a preset order after the communication device 120 is connected to the network and the statistic data has been retrieved, retrieve the battery pack 200 one after another until the history data of all the battery packs 200 has been retrieved. Since the history data is generated at any time, the charge and discharge management module 133 continuously takes turns to retrieve the history data of each battery pack 200.

The charge and discharge management module 133 of the portable power supply device 100 collects data of the portable power supply device 300 itself and receives data of the battery pack 200 and the power tool 300, and transmits it to the remote server 20 or the mobile terminal device 21 through the communication device 120. The battery pack 200 communicates with the charge and discharge management module 133 of the portable power supply device via the communication function of the second battery pack terminal 232. When the communication device 120 is connected to the network, the real-time data, statistical data, and history data of the portable power supply device 100, the battery pack 200, and the power tool 300 collected by the charge and discharge management module 133 can be transmitted to the remote server 20 or the mobile terminal device 21. The data of the portable power supply device 100, the battery pack 200, and the power tool 300 collected by the portable power supply device 100 saves data collection devices compared to separately collecting data for the portable power supply device 100, the battery pack 200, and the power tool 300. In addition, the data is more concentrated, which can facilitate data processing, for example, data deduplication and data classification, etc., saving manpower and material time.

In an example, the communication device 120 includes a Bluetooth module 1212 and a WIFI module 1211. The portable power supply device 100 can simultaneously communicate wirelessly with the remote server and the mobile terminal device by means of Bluetooth and WIFI. Specifically, the portable power supply device may upload the information to the remote server 20 in a WIFI manner through the WIFI module 1211 in the communication device 120, or may send the information to the mobile terminal device 21 via the Bluetooth module 1212 in a Bluetooth manner, the mobile terminal device. The information received by the portable power supply device 100 can also be uploaded to the remote server 20. The portable power supply device 100 transmits the acquired data to the remote server 20, which analyzes and processes the data.

Since the communication device 120 can send data to the remote server 20 through WIFI or Bluetooth, the data received by the remote server 20 may have data with or associated with the same time and the same device identity information, in order to reduce the amount of data stored and facilitate data sorting, the deduplication function can be introduced in the remote server 20, that is, the function of distinguishing the order of data according to the time to remove one of the data with the same time and device information in order to avoid data duplication and conflict.

Any authorized person can retrieve the required data from the remote server 20, and based on the data, the usage of the portable power supply device 100, the battery pack 200, and the power tool 300 can be understood, and based on the usage, data analysis results guide the relevant work, so that the staff does not need to go to the site for research and analysis, which is convenient for work and reduces costs.

The remote server 20 analyzes and processes the data and transmits the relevant operation information to the portable power supply device 100 or the mobile terminal device 21. Specifically, the remote server may transmit the above operation information to the portable power supply device 100 by WIFI, and the portable power supply device 100 automatically performs related operations. The remote server 20 may also send the operation information to the mobile terminal device 21 by WIFI. The mobile terminal device 21 can display the operation information, and then the user manually operates the portable power supply device 100 through the mobile terminal device 21, or the mobile terminal device 21 transmits the operation information to the portable power supply device 100 in a Bluetooth manner, and the portable power supply device 100 automatically performs the related operations.

Figure 9:
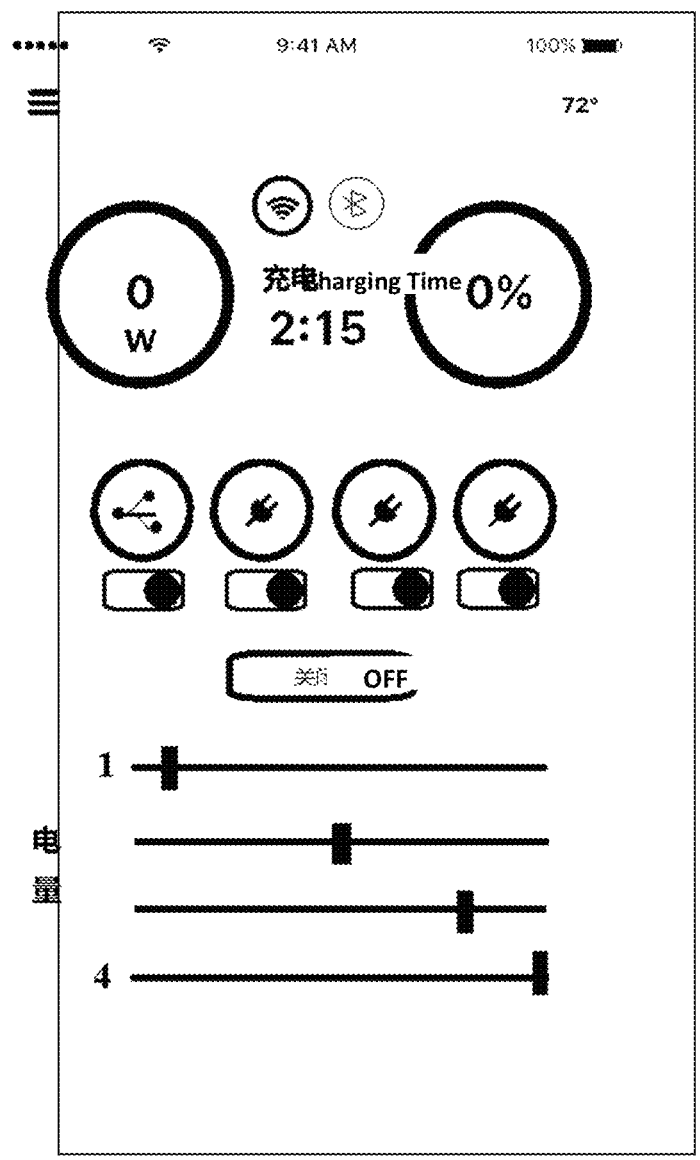
FIGS. 9-11 are user mobile phone application interfaces wirelessly connected to the electrical device of the third example.
Figure 10:
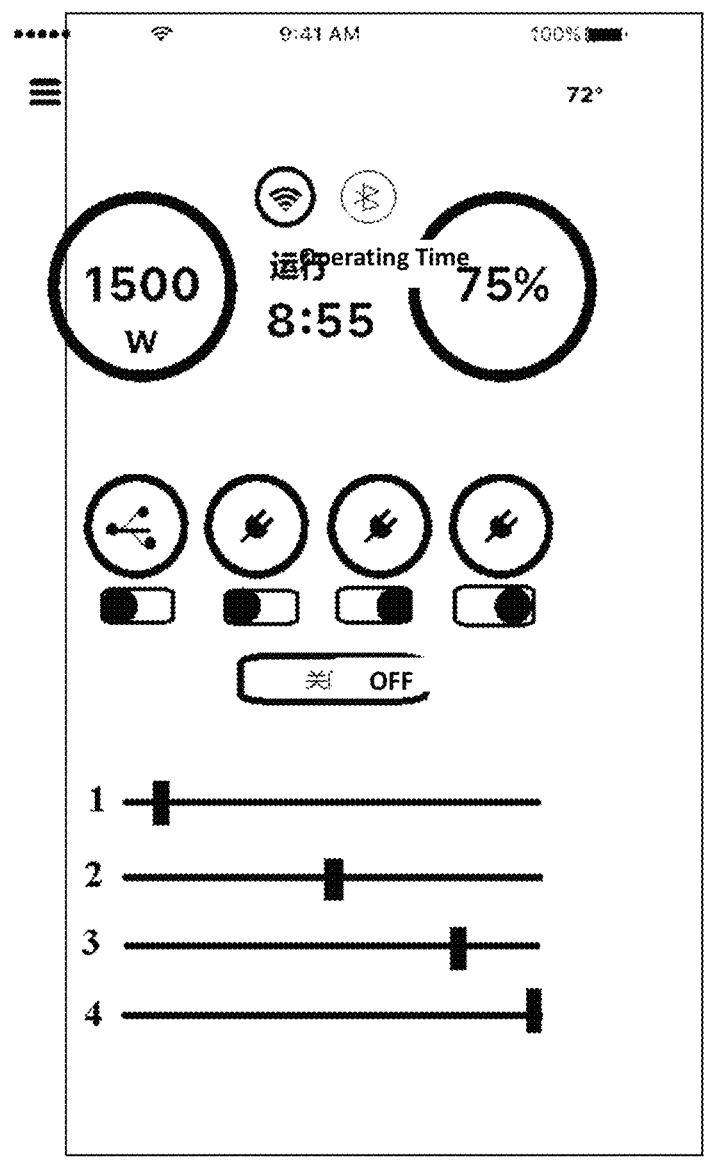
Figure 11:
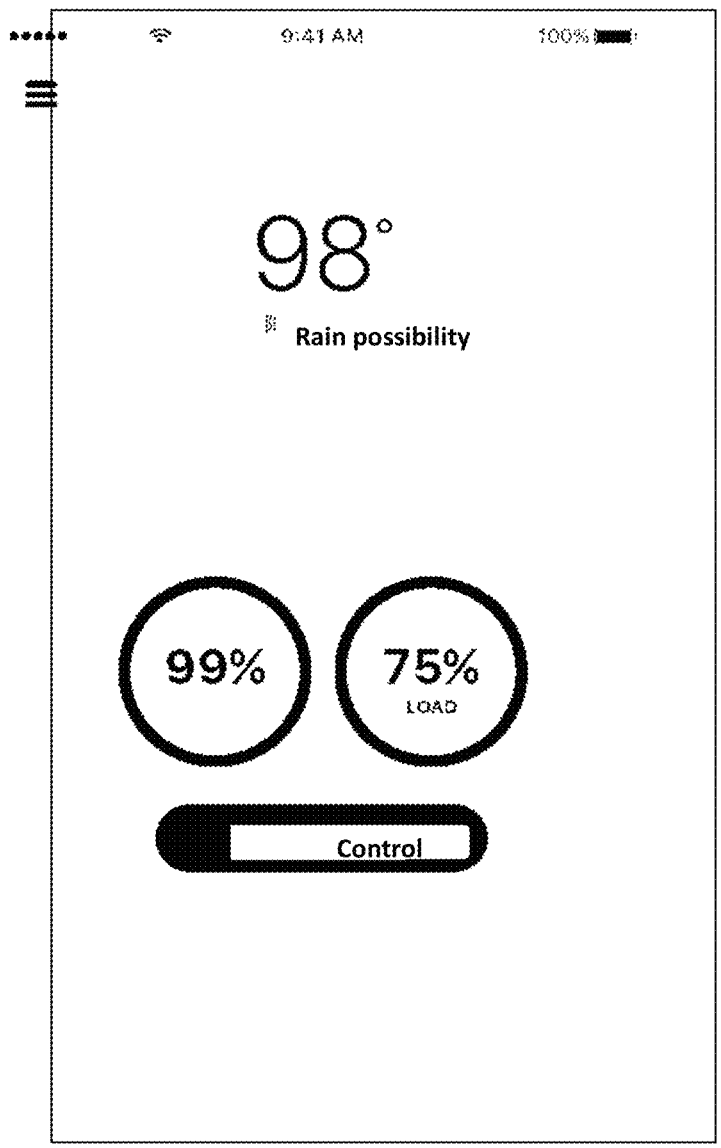

Referring to FIGS. 9-11, the user can remotely control the portable power supply device 100 by using the mobile terminal device 21 such as a mobile phone or the remote server 20 to execute remote operations such as turning on, turning off, timing on, timing off, and locking of the portable power supply device 100.

In one example, when the portable power supply device 100 is in the on state or the standby mode, the user can remotely control the power output of the portable power supply device 100 through an external device (for example, the remote server 20 or the mobile terminal device 21), that is, remotely turn the AC power output terminal or DC power output terminal on or off. The user can also set the switching time of the AC power output terminal or the DC power output terminal of the portable power supply device 100, that is, the timed control of the opening and closing of the AC power output terminal or the DC power output terminal. It should be noted that when the portable power supply device 100 is in the state of charging the battery pack 200, the user cannot turn off the AC power output terminal and/or the DC power output terminal by manual or remote control to prevent damage to the portable power supply device 100 and/or the battery pack 200. In addition, the power output of the portable power supply device 100 is based on the remaining capacity of the portable power supply device 100, and when the remaining capacity of the portable power supply device 100 is less than a certain preset value (for example, 15%), the remote control function cannot be activated. For the timing function, when the portable power supply device 100 receives the control instruction from the external device to start timing and set it as the start time of the preset event, the timed controlled preset event can be stored in the portable power supply device for a preset time (for example, 12 hour). If the bus power of the portable power supply device 100 is manually turned off, the preset event will be cleared.

In order to prevent the portable power supply device 100 from being stolen or mishandled, the user can also remotely lock the portable power supply device 100 with the remote server 20 or the mobile terminal device 21. In one example, for security reasons, the user can only lock and unlock the portable power supply device 100 with the mobile terminal device 21. The portable power supply device 100 is completely unusable when locked, and can only be unlocked by manual setting, specifically, cut off the bus power cannot unlock.

It should be noted that the portable power supply device 100 can receive a control instruction from an external device, which may come from Bluetooth or WIFI or other communication method. In order to avoid conflicts between control instructions, when there are multiple communication modes, the priority mechanism can be used to pre-set the priority of each communication mode, for example, to prioritize the Bluetooth control instruction.

In one example, the user remotely controls the portable power supply device 100 through an application on the mobile terminal device 21 such as a mobile phone having a network communication function, and the mobile terminal device 21 can display various information on the portable power supply device 100, including the output power of the portable power supply device 100, the total remaining charging time, the usage status of each output terminal and/or input terminal, the power consumption of each battery pack and/or the remaining power, the voltage of each battery pack, whether it is in over-temperature protection, low-voltage protection. The mobile phone can also display fault information for the portable power supply device, and the application on the mobile terminal device 21 can provide a solution to the fault. When the above fault message appears, the application can also provide a solution, for example, prompting the user to turn on or off the portable power supply device, contact the after-sales, and the like.

The portable power supply device 100 can report its fault information to the mobile terminal device 21 via Bluetooth or WIFI, and the mobile terminal device 21 can report the fault to the remote server 20. The remote server 20 records the failure information and synchronizes the failure information to the after-sales service.

The fault information reported by the portable power supply device 100 includes recoverable errors and unrecoverable errors, and the recoverable errors include over-temperature, overload, low voltage, etc., and the user can solve the recoverable error according to the provided solution; the unrecoverable errors include inverter error, rectifier error, fan error, charge and discharge management module error, etc., users generally cannot solve unrecoverable errors, and need to synchronize the error to the after-sales service. The after-sales provide solutions.

The application on the mobile terminal device 21 can calculate the remaining time or the remaining charging time of the portable power supply device 100 based on the output power of the portable power supply device 100. The user can also set the operating time for the portable power supply device 100 through the application, and the portable power supply device 100 outputs the maximum power as much as possible according to the set time. The application may also give advice to disconnect and/or remove the battery pack 200 interfaced with the portable power supply device 100, the desired remaining time or remaining charging time, recommendations for turning on and/or off power output, or remote turning on and/or off the power output terminals.

With continued reference to FIGS. 9-11, the portable power supply device 100 can send a reminder directly or through the remote server 20 to the user mobile terminal device 21, depending on its own conditions and/or data analysis information of the remote server 20. For example, when the portable power supply device 100 is in an overload state, a low battery level, a completed charging state, or the like, the portable power supply device 100 transmits a reminder to the user mobile terminal device 21 directly or transmits a reminder to the user mobile terminal device 21 through the remote server 20. The remote server 21 analyzes and processes the received data information of the portable power supply device 100, the data information transmitted by the user mobile terminal device 21, and other information, and can recognize the user's habits and provide customized information or reminders.

When there is a problem with the software of a certain device in the portable power system (for example, the portable power supply device 100, the battery pack 200, or the power tool 300) or a program change or software upgrade is required for the already shipped product, the device needs to be disassembled and debugged to implement product software changes, which not only requires a lot of manpower and resources, but also delays the project cycle. For this reason, there is an urgent need for a convenient software change or upgrade method.

To address the above issues, a method of applying boot loader to change or upgrade product software is provided.

The boot loader is a Microcontroller Unit (MCU) that operates part of its own flash memory to realize application program changes and to implement product firmware upgrades. In this way, it is possible to communicate with the MCU inside the product through the reserved communication interface on the product, so that the MCU calls the boot loader to make changes to the application program, and implements product firmware update and upgrade.

Figure 12:
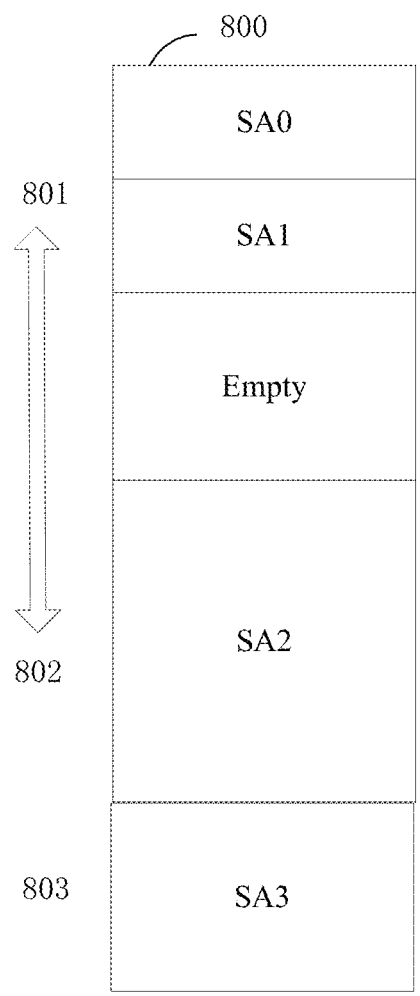
FIG. 12 is a schematic diagram of the memory partitioning of a flash memory.

Referring to FIG. 12, using the boot loader to implement firmware upgrade requires writing a two-part program when designing the firmware program. The first part of the program does not perform normal function operations, it only receives external data and instructions by communication, and verifies the information of the second part of the program (whether complete, version information, etc.) and updates the second part of the program, that is, the boot loader 801; the second part of the program is the corresponding product function code, that is, the application program 802. The flash memory 800 allocates memory partitions to the boot loader 801 and the application program 802 with respect to actual conditions. For example, the flash memory 800 allocates two partitions SA0 and SA1 to the boot loader 801, and allocates one partition SA2 to the application program 802. The flash memory may also stores identity information 803 about the device, which may be stored in partition SA3.

The boot loader 801 has the functionality to read and write programs, it can read the data information stored in the flash memory 800, and write the data information into the storage module, it can also overwrite all the application programs stored in the flash memory 800 with programs. The boot loader 801 performs reading, writing, and/or erasing by calling instructions of some predetermined functions. For example, calling the read command "R" can read the data information in the flash memory 800, calling the erase command "E" can erase any one of the memory module segments or all the memory module segments, and calling the write command "W" can write data to any of the memory module segments or all memory module segments.

The boot loader 801 stores an executable program in the flash memory 800 of the MCU, and is capable of reading data in the flash memory 800 or writing data to the flash memory. When the application stored in the flash memory 800 needs to be updated, the original application program can be replaced with the new application program by writing the new application program 802 to the application program area by the boot loader 801.

Since the boot loader 801 and the application program are both stored in the flash memory 800 of the MCU, if the address of the program called by the MCU is incorrect, the MCU may execute the boot loader 801 erroneously. In order to solve this problem, in actual operation, an upgrade key is introduced to start program update.

In the portable power system described above, the power tool 300, the battery pack 200, and the portable power supply device 100 can all implement software update and upgrade by applying the boot loader 801. Hereinafter, a method of updating the power tool 300, the battery pack 200, and the portable power supply device 100 by the boot loader 801 will be described using the portable power system as an example.

Example 1: Program update by bus scheduling.

In the bus communication system, the host computer connects the MCUs of a plurality of modules through the bus, and the host computer as the communication device 120 can selectively update the program of any one or more modules mounted on the bus by using the bus scheduling manner. For convenience of description, each module is referred to as a node 502. For example, the first node is called node 1, the second node is called node 2, . . . , and the Nth node is called node N.

Figure 13:
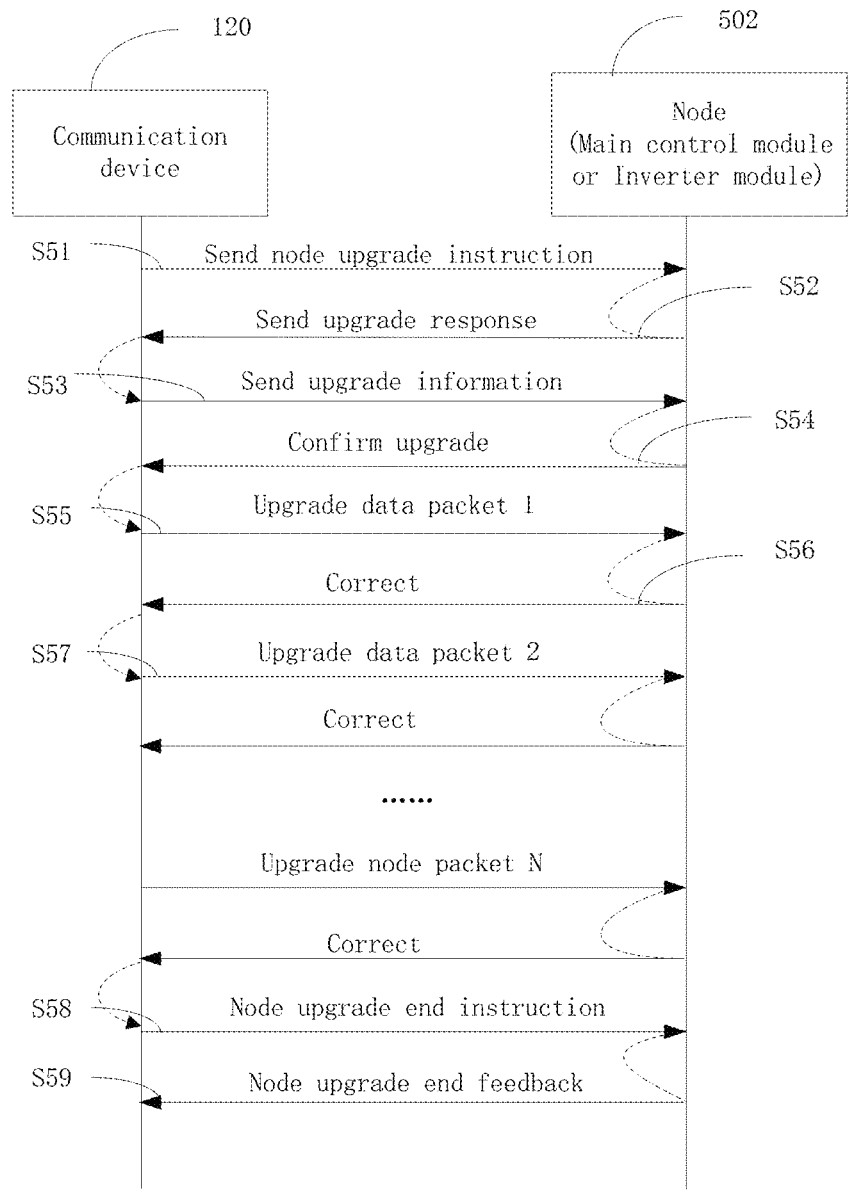
FIG. 13 is an information exchange process between the communication device and the node in the upgrade mode.

Referring to FIG. 13, in the upgrade mode, the interaction process of the communication device 120 and the node 502 is as follows:

S51: The communication device 120 sends a node upgrade instruction;

S52: The node 502 receives the node upgrade instruction and determines whether upgrade the node, and if yes, sends an upgrade response (including node identity information) to the communication device 120; if not, stops the original work and enters the listening state (standby state);

S53: The communication device 120 determines whether the node 502 identity information in the upgrade response matches, and if yes, enters an upgrade mode, and sends upgrade information (including an upgrade key);

S54: The node 502 receives the upgrade information, and confirms the upgrade to the communication device 120;

S55: The communication device 120 sends the first upgrade data packet to the node 502;

S56: After receiving the upgrade data packet, the node 502 verifies whether the upgrade data packet is correct, and if correct, replies the correct information to the communication device 120;

S57: The communication device 120 sends the next upgrade data packet to the node 502, and proceeds to step S6;

S58: After all the upgrade data packets are completely sent, the communication device 120 sends a node upgrade end instruction;

S59: The node 502 receives the node upgrade end instruction, and feeds back the node upgrade end confirmation information.

Figure 14:
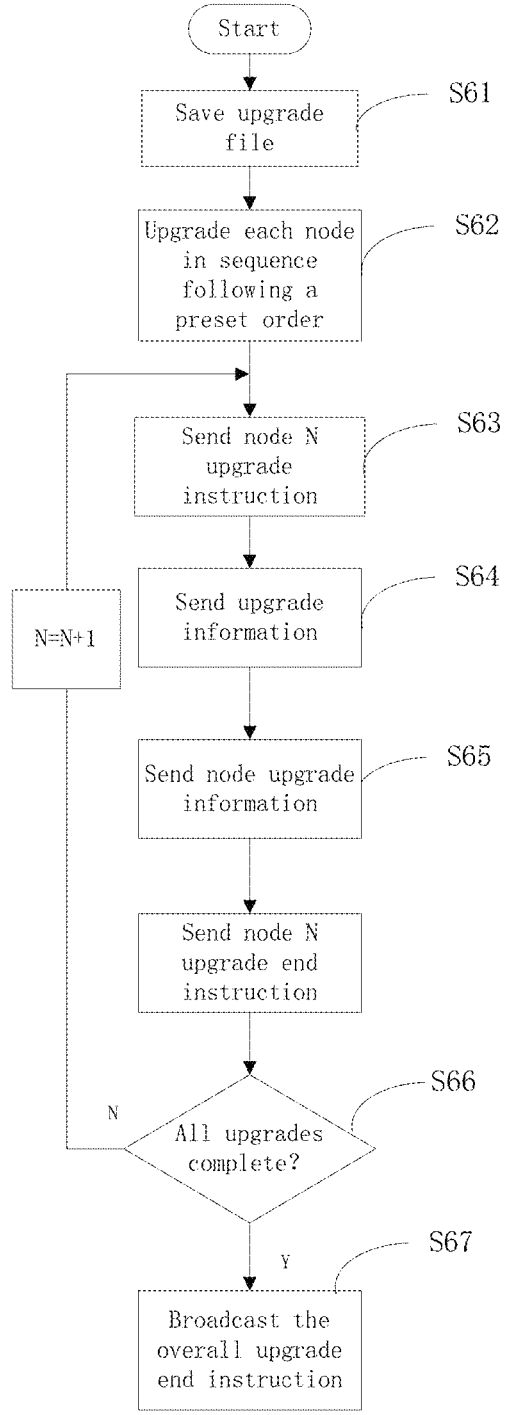
FIG. 14 is a work flow chart of the communication device in FIG. 13.
Figure 15:
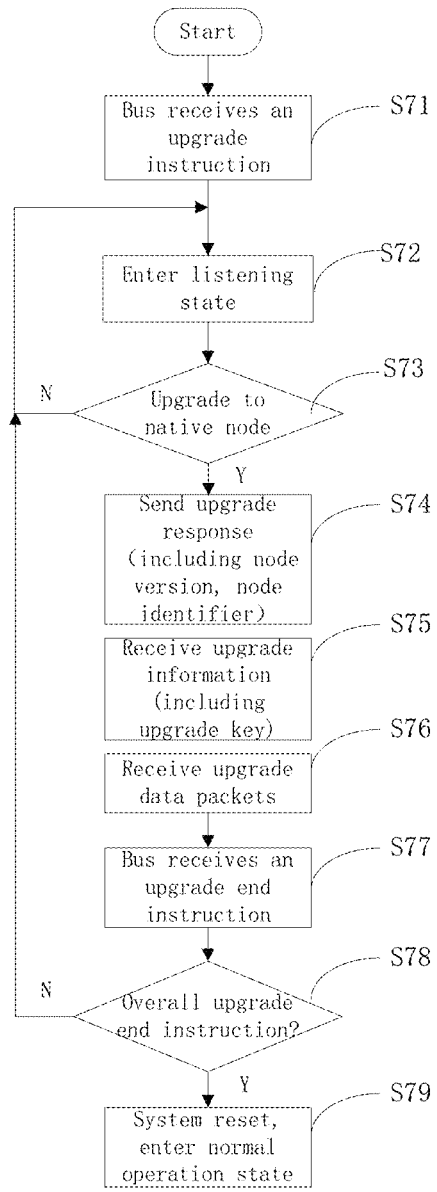
FIG. 15 is a work flow chart of the node in FIG. 13.

The operation process of the communication device 120 and the node 502 in the upgrade mode will be described in detail with reference to FIGS. 14 and 15. Referring to FIG. 14, the operation process of the communication device 120 in the upgrade mode is as follows:

S61: Save the upgrade file from an external device (for example, the remote server 20, the mobile terminal device 21);

S62: Upgrade each node in sequence following a preset order;

S63: Send the node N upgrade instruction;

S64: Send the node N upgrade data packet;

S65: Node N upgrade completed and send the node N upgrade end instruction;

S66: Determine whether all nodes are upgraded, if yes, go to step S67, if not, turn to the next node N (N=N+1), then go to step S63;

S67: Broadcast the overall upgrade end instruction.

During the upgrade process, abnormal situations may occur, causing the upgrade program received by the node 502 to be incomplete, thereby affecting the normal operation of the node 502. This problem can be solved by setting an upgrade end identifier. Specifically, after the node upgrade is completed, the node 502 checks if there is an upgrade end identifier in the received upgrade program, and if not, indicates that the upgrade program received this time is abnormal (incomplete), then the node enters the forced upgrade mode. In the forced upgrade mode, the node enters the active upgrade mode and actively initiates the upgrade request (including the node identity information), and the communication device 120 enters the passive upgrade mode to upgrade the corresponding node.

It should be noted that, in the process of receiving the upgrade program of the external device, the communication device 120 may suffer from abnormalities such as power failure and network failure, causing the upgrade program received by the communication device 120 to be abnormal, and the upgrade process cannot proceed. To solve this possible problem, it is necessary to keep the latest correct upgrade program in the communication device 120 so that the upgrade program can be called to complete the node upgrade when an upgrade is required.

The upgrade process of each node is a node upgrade of a close cooperation system, and each node of the bus system needs to enter the upgrade mode and exit the upgrade mode synchronously. Referring to FIG. 15, the operation process of each node in the upgrade mode is as follows:

S71: The bus receives an upgrade instruction from the communication device 120;

S72: All nodes stop working and enter the upgrade listening state (standby state);

S73: Each node detects whether there is an upgrade instruction for itself, if yes, enters an upgrade mode, and if not, stays in the listening state;

S74: The corresponding node enters the upgrade mode, and replies the upgrade information (including the node identity information, the node identifier, and the like) of the node, and confirms the upgrade;

S75: Receive upgrade information (including an upgrade key) of the communication device 120;

S76: Receive upgrade data packets from the communication device 120 through the bus, and verify whether the data packet is correct, and reply the correct information;

S77: Upgrade data packets transmission completed, the bus receives an upgrade end instruction, determines whether it is the overall upgrade end instruction, if yes, proceeds to step S78, and if not, proceeds to step S73;

S78: All upgrades completed, the system is reset, and all nodes are restored.

After the node 502 is upgraded, the node 502 needs to check the received upgrade program. If the received program is found to be abnormal (for example, the program is incomplete), the node 502 will actively send an upgrade request to perform a forced upgrade. The communication device 120 passively responds to the upgrade request of the corresponding node, and upgrades the node 502.

When the communication device upgrades the node that needs to be upgraded through the bus, the data communication format sent to the bus includes the target address of the node to be upgraded, or the identifier of the node/module to be upgraded.

Figure 16:
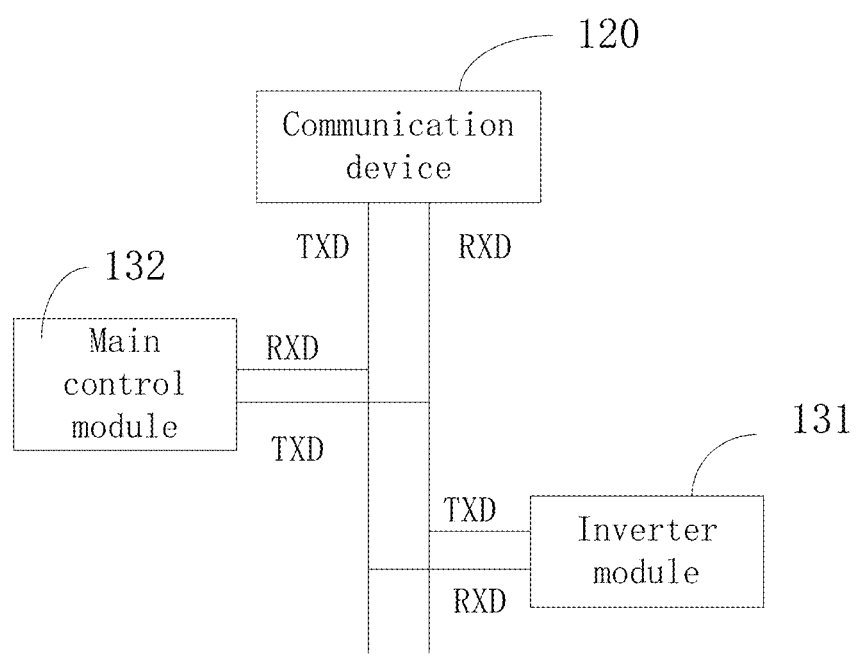
FIG. 16 is a specific wiring diagram of the communication device, the main control module and the inverter module.
Figure 17:
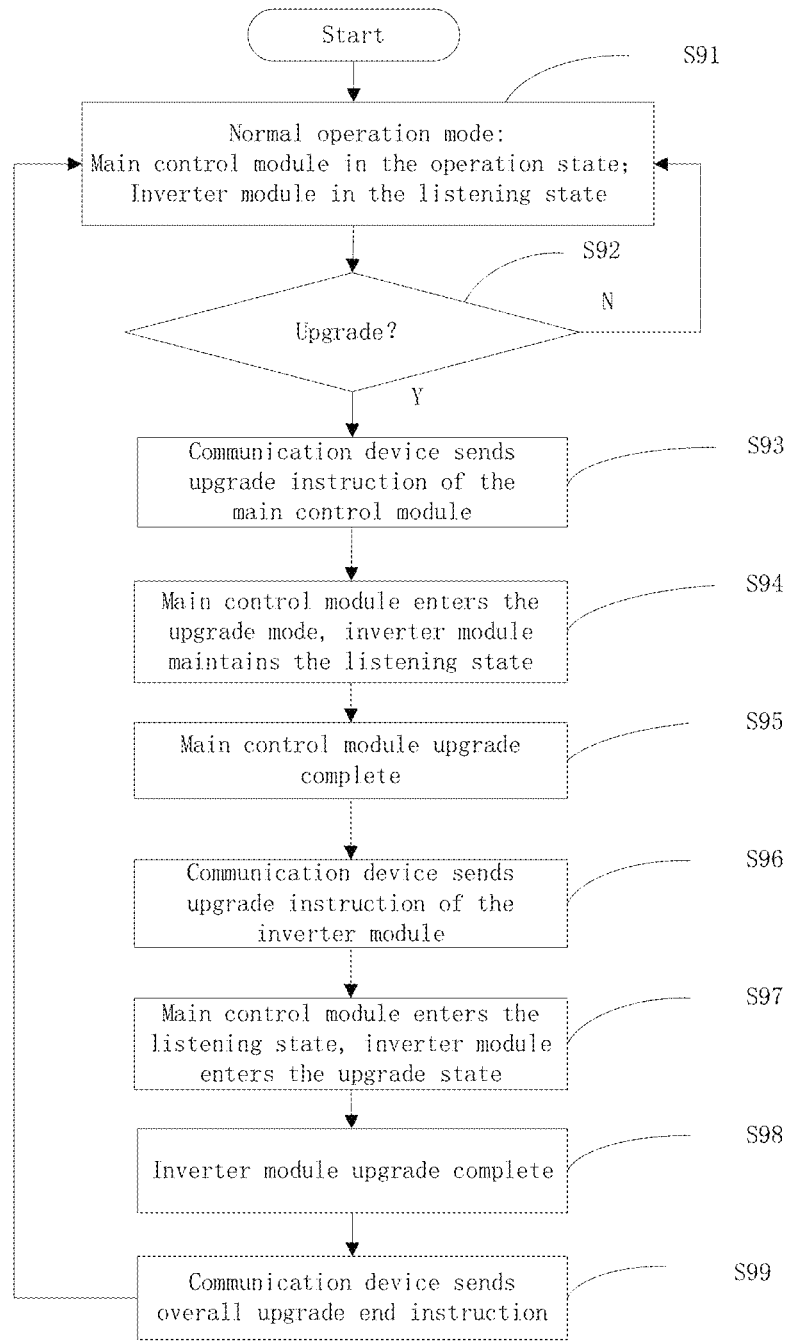
FIG. 17 is a work flow chart of the firmware upgrade of the main control module and the inverter module by the communication device.

Referring to FIGS. 16 and 17, a method of performing upgrade by the bus will be illustrated by using the example of the communication device 120 upgrading the main control module 132 and the inverter module 131 of the portable power supply device 100.

The upgrade program is stored in the remote server 20. The remote server 20 can send the upgrade file directly to the communication device 120 by WIFI, or send or copy the upgrade file to the mobile terminal device 21 (iPad, mobile phone, etc.), and then make use of the mobile terminal device 21 to transmit the upgrade file to the communication device 120 via Bluetooth.

Specifically, the remote server 20 may directly send the upgrade file to the communication device 120 by means of WIFI to perform a firmware upgrade process as follows: when the portable power supply device 100 requires a firmware upgrade, the remote server 20 sends an upgrade prompt message to the user's mobile phone APP, and the user selects to upgrade. After receiving the upgrade instruction from the user, the remote server 20 sends the upgrade file to the communication device 120 by WIFI mode, and the communication device 120 upgrades the firmware of the main control module 132 and the inverter module 131 mounted on the bus through the bus scheduling method. The communication device 120 sends an upgrade instruction to the main control module 132 and the inverter module 131. Once each module detects that there is an upgrade instruction on the bus, all the current operations are stopped, and whether the upgrade instruction is an upgrade instruction to the native node is detected. If not, then continue to keep the listening state (standby state), if yes, then enter the upgrade mode. The communication device 120 upgrades the main control module 132 and the inverter module 131 in a preset order.

In the upgrade mode, the communication device 120 is connected to the first node main control module 132 and the second node inverter module 131 via a serial bus. Referring to FIG. 16, the specific wiring method is as follows: in the normal operation mode, the receiving pin RXD and the transmitting pin TXD of the serial port of the main control module 132 are both in the enabled state, and the serial port of the inverter module 131 is in the listening state (standby state), that is, the receiving pin RXD is in the enabled state, and the transmitting pin TXD is in the normal I/O input state; in the upgrade mode, after receiving the corresponding module upgrade instruction from the bus, the corresponding module enters an enabled state, that is, both the receiving pin RXD and the transmitting pin TXD of the serial port of the corresponding module are in the enabled state, while the other module is in the listening state, and resumes normal operation after the upgrade is completed. The communication device 120 performs firmware upgrade of the main control module 132 and the inverter module 131 by the bus in a preset order.

In one example, the communication device 120 performs firmware upgrade on the main control module 132 and inverting module 131 in the order of main control module 132 first and then inverting module 131. Referring to FIG. 17, the upgrade process of the IOT to the main control module 132 and the inverter module 131 in the upgrade mode will be described.

S91: In the normal operation mode, the serial port of the main control module 132 is in the transceiver enabled state, that is, the receiving pin RXD and the transmitting pin TXD of the serial port of the main control module 132 are both in the enabled state; the serial port of the inverter module 131 is in the listening state, that is, the receiving pin RXD of the inverter module 131 is in the enabled state, and the transmitting pin TXD is in the normal I/O input state;

S92: The communication device 120 checks whether an upgrade instruction is received, if yes, proceeds to S93, and if not, proceeds to step S91;

S93: The communication device 120 sends an upgrade instruction of the main control module 132 to upgrade the main control module 132 first.

S94: The main control module 132 enters the upgrade mode, the serial port of the main control module 132 is in the transceiver enabled state, and the inverter module 131 is in the listening state;

S95: The upgrade of the main control module 131 is completed;

S96: The communication device 120 sends an upgrade instruction of the inverter module 131 to upgrade the inverter module 131.

S97: The inverter module 131 enters the upgrade mode, and the main control module 132 enters the listening state, and the serial port of the inverter module 131 is in the transceiver enabled state;

S98: The upgrade of the inverter module 131 is completed.

S99: The communication device 120 sends the overall upgrade end instruction, and the upgrade is completed, and the system restores normal operation.

The upgrade file is sent to upgrade the main control module 132. After the upgrade of the main control module 132 is completed, the communication device 120 sends a node upgrade end instruction thereto, and the main control module 132 feeds back the node upgrade end instruction. Then, the communication device 120 performs program upgrade on the inverter module 131 of the next node in the same manner. After the upgrade of the inverter module 131 is completed, the communication device 120 sends a node upgrade end instruction thereto, and the inverter module 131 feeds back the node upgrade end instruction. The main control module 132 broadcasts the overall upgrade end instruction to the bus, and each module detects the overall upgrade end instruction on the bus, and then restores normal operation, and this upgrade is all completed.

Example 2: Program update by upgrade device 500.

The communication mode between the existing power tool 300 and the battery pack 200 is single-line communication, and has a corresponding communication protocol for discharging management of the battery pack 200. The program of the power tool 300 can be updated according to the method of the above-described update procedure. By mounting the wireless communication module 121 on the communication line, and by a predetermined communication protocol to transmit program information, the program of the battery pack 200 or the tool can be updated and upgraded.

However, the addition of the wireless communication module 121 incurs a certain cost. In order to reduce costs, an upgrade device 500 that connects to the tool or battery pack 200 to perform program update of the power tool 300 or the battery pack 200 may be designed. The upgrade device 500 stores the upgrade file of the power tool 300 or the battery pack 200 in advance, and has a communication terminal that communicates with the communication terminal of the power tool 300 or the battery pack 200. When an upgrade is required, connect the upgrade device 500 to the power tool 300 or the battery pack 200 through respective communication terminals to establish a communication connection, and transmit the upgrade file in the upgrade device 500 to the power tool or battery pack 200 according to a predetermined communication protocol, thereby product updates and upgrades can be realized.

(1) A method to update the program of the power tool 300.

The power tool 300 can be any type of power tool including but not limited to, electric drills, electric hammers, screwdrivers, impact drills, electric circular saw jigsaws, reciprocating saws, band saws, electric scissors, sanders, angle grinders, lamps, lasers, nail guns, etc.

Figure 18:
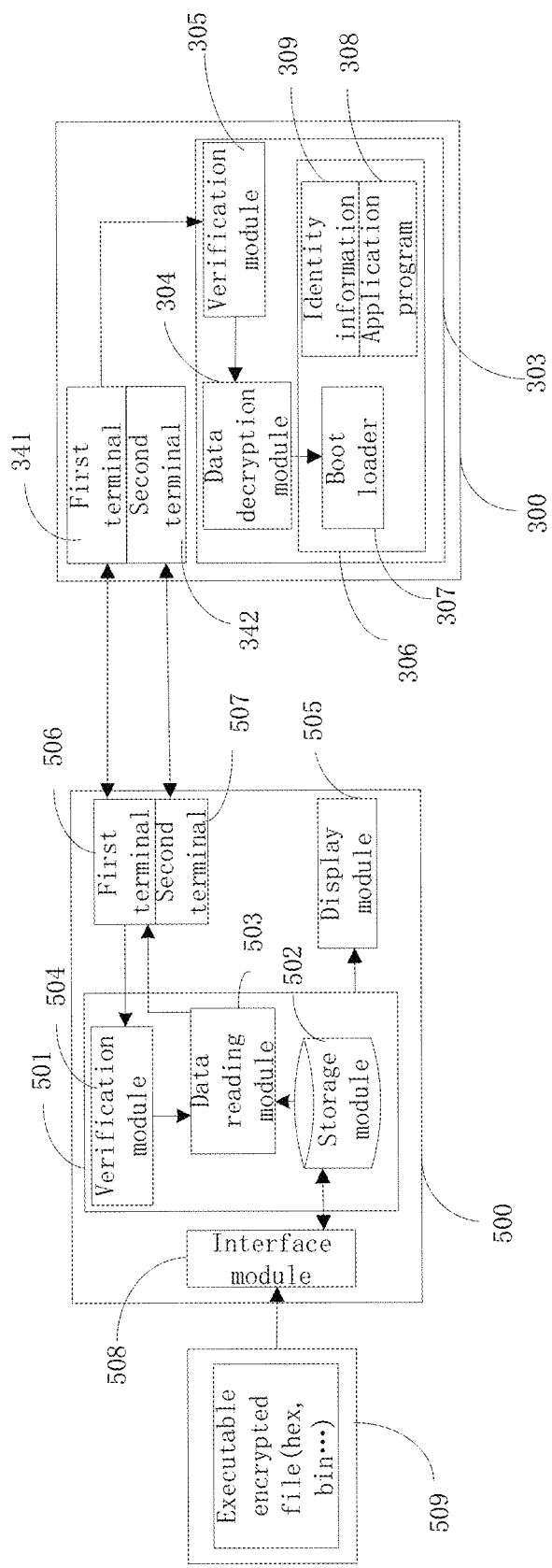
FIG. 18 is a schematic diagram of the internal structure of the upgrade device and the power tool.

Referring to FIG. 18, the power tool 300 has a micro control module 303 (hereinafter referred to as "MCU"), and the MCU 303 includes a flash memory 306 in which the tool application program 308, the tool boot loader 307, and the identity information 309 of the power tool 300 are stored. The flash memory 306 may have a plurality of memory partitions including a partition for storing the application program 308, a partition for storing the boot loader 307, and a partition for storing the identity information 309 of the power tool 300. The above memory partitions can be read or erased or rewritten.

The application program 308 runs in the operation mode for controlling the operation of the power tool 300, such as controlling the rotational speed of the motor, controlling the motor to start in a specified manner, and the like. The boot loader 306 runs in the upgrade mode for updating at least a portion of the application.

For the power tool 300 without the communication device 120 or the wireless communication module 121, a device is required to import the new application program into the flash memory of the power tool 300 to update and/or upgrade the application program 308 in the flash memory 306. The device is a dedicated device for upgrading the program of the power tool 300, hereinafter referred to as an upgrade device 500.

With continued reference to FIG. 18, in one example, the upgrade device 500 includes an MCU 501 that includes a storage module 502 for storing data or programs, a data reading module 503 for reading data, and a verification module 504 that verifies information such as whether the power toll 300 matches the upgrade device 500. The upgrade device 500 also includes a display module 505 for human-machine interface display, and the display module 505 can display the remaining time or progress of the upgrade. The upgrade device 500 also has an interface module 508 for connecting to an external storage device 509. The external storage device 509 may be a removable memory card, a memory chip or a storage module, such as a TF card, a USB flash drive, etc., or may be another device that can be connected to the upgrade device 500 with or without wire, such as a PC or the like. The external storage device 509 stores the latest application program for updating one or more of the power tools 300. The latest application program may partially or completely overwrite the old application program in the power tool 300. The upgrade device 500 obtains the latest application program for the one or more of the power tools 300 stored in the external storage device 509 through the interface module 508 and stores it to the storage module 502 to upgrade the software programs of the different power tools 300.

The upgrade device 500 has a communication interface for connection to the power tool 300. The communication interface is used by the micro-control module of the power tool 300 to establish communication with the upgrade device 500 to complete the program update of the power tool 300. The MCU 303 of the power tool 300 can transmit information to the external device through the communication interface, for example, the MCU 303 of the power tool transmits the identity information of the power tool 300 to the upgrade device 500 through the communication interface. The MCU 303 of the power tool can also receive the signal of the upgrade device 500 through the communication interface, and perform a response process based on the signal, for example, the MCU 303 receives the signal of the upgrade device 500, and decides whether to enter the operation mode or the upgrade mode. The communication interface may be a dedicated signal terminal (e.g., a data terminal) or a multiplexed shared terminal (e.g., a temperature signal terminal). The communication interface can be a single terminal or a plurality of terminals. In order to simplify the program, two terminals may be used for communication.

The power tool 300 has two physical interfaces—a first tool terminal 341 and a second tool terminal 342, and the upgrade device 500 has an first upgrade terminal 506 and an second upgrade terminal 507 corresponding thereto, respectively used to connect with the first tool terminal 341 and the second tool terminal 342 of the power tool 300.

In the normal operation mode of the power tool 300, that is, when the battery pack 200 is connected to the power tool 300, the first tool terminal 341 is used to establish communication between the power tool 300 and the battery pack 200, and the second tool terminal 342 is used to transmit the temperature signal of the battery pack 200 or identify the attribute of the battery pack 200.

In the upgrade mode of the power tool 300, that is, when the upgrade device 500 is connected to the battery pack 200, the first tool terminal 341 is used to identify the upgrade device 500, which keeps the original communication function, the communication protocol, and the communication content the same. At this time, the second tool terminal 342 is multiplexed, which is used to establish communication between the power tool 300 and the upgrade device 500, and receive and transmit data information during the upgrade process.

Specifically, in one example, the power tool 300 identifies whether the external device interfaced with the power tool 300 is the battery pack 200 or the upgrade device 500 by identifying whether the voltage of the first tool terminal 341 is a high voltage or a low voltage. For example, when the external device is interfaced with the power tool 300 and the voltage of the first tool terminal 341 is pulled low, the power tool 300 recognizes that the external device is the upgrade device 500.

After the power tool 300 recognizes that the external device is the upgrade device 500, it enters the upgrade mode. The MCU 303 of the power tool executes a boot loader 307 to perform a program update process. Since the upgrade device 500 stores one or more of the latest programs for program update of different power tools 300, it is necessary to select the corresponding latest program for the specific power tool 300 when performing program update. To this end, the identity information 309 representing the power tool 300 and/or the upgrade device 500 may be stored in the flash memory 306 of the MCU 303 of the power tool 300 in advance, and the representative power tool 300 and/or the storage module in the upgrade device 500 may also be stored. And the identity information representing the power tool 300 and/or the upgrade device 500 is also stored in the storage module of the upgrade device 500, so that the power tool 300 and the upgrade device 500 can be matched correctly before the old application program 308 of the power tool 300 is rewritten, preventing a wrong program update, which causes the power tool 300 to fail to run correctly after the program is updated. The upgrade device 500 has a verification module 504, and each power tool 300 has a verification module 305. In one example, the verification module 504 of the upgrade device 500 is configured to verify the identity information of the power tool 300, and the verification module of the power tool 300 is used to verify whether the data in the data transmission is correct, whether the program is complete, as well as the identity information of the upgrade device 500.

During the program update process, the boot loader 307 needs to write a new program in the upgrade device 500 into the memory partition of the application program 308 of the power tool 300. The data packet of the new application may be large such that cannot be transmitted in one time. The data packet of the new application may be split into a plurality of small data packets to ease multiple transmissions. During the transmission of the plurality of packets, the sequence of the packets may be disordered, causing the newly written program to be incorrect. In order to solve this problem, the data packets may be numbered, and at the time of data transmission, the number is verified to ensure that the data packets are sequentially written to the corresponding partitions of the flash memory 306 of the power tool 300 in order.

Specifically, the power tool 300 and the upgrade device 500 transmit the data information involved in the upgrade process by the second upgrade terminal 507 and the second tool terminal 342, the data including upgrade instructions, upgrade end instructions, feedback replies, upgrade data packets, and the like.

During the upgrade process, the boot loader needs to write the new program in the upgrade device to the memory partition of the application program of the power tool. The data packet of the new application program (i.e., the upgrade program) may be relatively large such that cannot be transmitted in one time. Therefore, the data packet of the new application needs to be split into multiple small data packets to ease multiple transmissions. During the transmission of the plurality of packets, the sequence of the packets may be disordered, causing the newly written program to be incorrect. In order to solve this problem, the data packets may be numbered, and at the time of data transmission, the number is verified to ensure that the data packets are sequentially written to the corresponding partitions of the flash memory of the power tool in order.

Specifically, the power tool 300 and the upgrade device 500 transmit, through the second terminal, the data packets involved in the upgrade process, where the data packets include upgrade instructions, upgrade end instructions, feedback replies, upgrade data packets, device identity information, and the like, and the content of the data packets includes the packet header, data length, data type, packet serial number, data content, device ID, check digit. Wherein, the data type refers to whether the data is real-time data or statistical data or an upgrade program, and the packet serial number is the serial number of each data packet.

In the operation mode, the power tool 300 executes the application program 308 in the flash memory 306, whereas the boot loader 307 is also stored in the flash memory 306. If the address of the program called by the MCU 303 is incorrect, the MCU 303 may execute the boot loader 307 by mistake, such that the running power tool 300 may work improperly, or may even bring a security risk. This problem can be solved by introducing an upgrade key, which is used to instruct the application to upgrade.

Specifically, after the upgrade device 500 confirms that the upgrade is possible, an upgrade key is sent to the MCU 303 of the power tool 300. After receiving the upgrade key, the MCU 303 confirms that it is an upgrade instruction of the application program, and then executes the boot loader 307 to upgrade the software program of the power tool 300. The MCU 303 of the power tool 300 will only launch the boot loader 307 after receiving the upgrade key sent by the upgrade device 500, otherwise the boot loader 307 will not be executed. In this way, it can be ensured that the boot loader 307 is executed only when a program update is required, and is not executed under the operation mode of the power tool 300 for the safety operation of the power tool 300.

Figure 19:
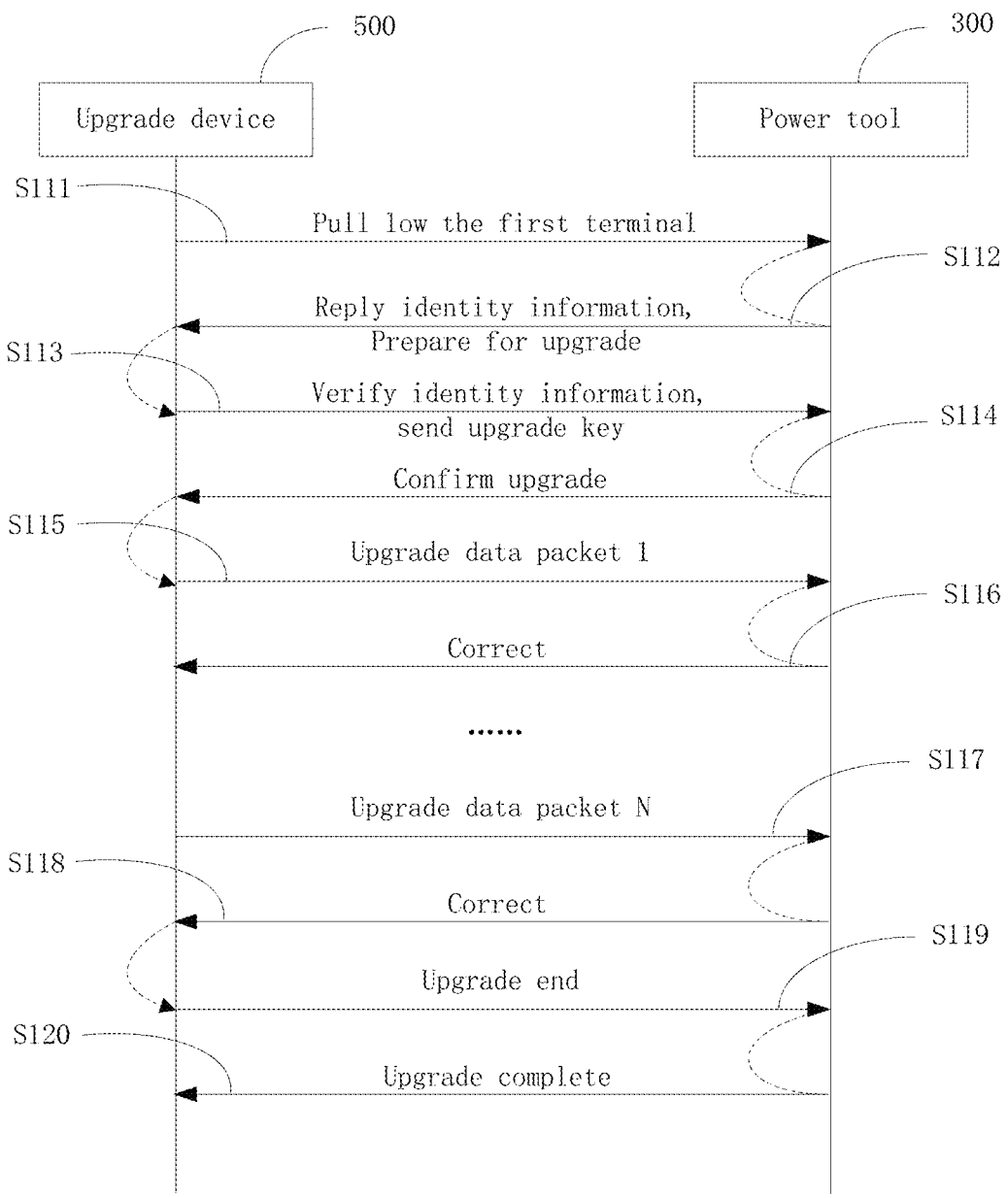
FIG. 19 is the information exchange process between the upgrade device and the power tool shown in FIG. 18 in the upgrade mode.

Next, a method of performing program upgrade of the power tool 300 by the upgrade device 500 will be described with reference to FIGS. 19.

First, the upgrade device 500 needs to acquire the latest program stored by the external storage device through the interface module 508 and store it in its own storage module 502. Then, the user connects the upgrade device 500 to the power tool 300 that needs to be upgraded, the first tool terminal 341 establishes a connection with the first upgrade terminal 506, and the second tool terminal 342 establishes a connection with the second upgrade terminal 507. The voltage of the first tool terminal 341 is pulled low, the power tool 300 detects that the first tool terminal 341 is at a low voltage, and the power tool 300 enters the upgrade mode. The upgrade device 500 and the power tool 300 perform information interaction through the second tool terminal 342 and the second upgrade terminal 507. It should be noted that, when the upgrade device 500 is connected to the power tool 300 to be upgraded, the first upgrade terminal 506 of the upgrade device 500 is a trigger terminal, and the second upgrade terminal 507 is a data transmission terminal.

It should be noted that, in the operation mode of the power tool 300, it is not appropriate to stop the power tool 300 for program update. Before the power tool 300 is powered on, the upgrade device 500 could be connected thereto to perform the program update of power tool 300.

The following describes the information exchange process of the upgrade device 500 and the power tool 300 in the upgrade mode:

S111: The power tool 300 detects that the first tool terminal 341 is of a low voltage signal and enters the upgrade mode.

S112: The power tool 300 returns its identity information to the upgrade device 500 and prepares for upgrade;

S113: The upgrade device 500 verifies the identity information of the power tool 300, determines whether to upgrade, and if an upgrade is possible, sends an upgrade key to the power tool 300;

Specifically, the upgrade device 500 compares the received identity information 309 of the power tool 300 with the identity information of one or more power tools 300 stored in advance in the storage module 502, and confirms whether the storage module 502 stores the received identity information 309, if yes, determines that the upgrade device 500 can upgrade the power tool 300, and if not, determines that the upgrade is not possible.

S114: The power tool 300 obtains the upgrade key, confirms the upgrade, and replies to the upgrade to the upgrade device 500;

S115: After the upgrade device 500 receives the upgrade confirmation signal of the power tool 300, the upgrade device 500 starts to send the first upgrade data packet;

S116: After the power tool 300 receives the data packet, the power tool 300 verifies whether the data packet is correct, and if correct, replies the correct message to the upgrade device 500;

S117: After the upgrade device 500 receives the correct reply, the upgrade device 500 continues to send the next data packet until the last data packet;

S118: The power tool 300 receives the last data packet and replies correct;

S119: The upgrade device 500 sends an upgrade end flag to the power tool 300;

S120: After the power tool 300 receives the upgrade end flag, the power tool 300 replies that the upgrade is completed.

It should be noted that, in the upgrade mode of the power tool 300, abnormal situations (for example, power failure) may occur, which may result in the upgrade program or the upgrade file not being completely written into the flash memory 306 of the power tool 300, and the application program 308 of the power tool 300 being an incomplete program. In the operation mode of the power tool 300, if the incomplete application program runs, the power tool 300 may not work properly or even malfunction, posing a security risk.

In order to solve this problem, you can add flags to the beginning and end of the upgrade program, for example, add the program start flag in the first upgrade data packet, and add the program end flag in the last upgrade data packet. If the power tool 300 does not receive the program end flag, then the upgrade program that is written to the power tool 300 is considered to be incomplete and the incomplete upgrade program will not be executed. The application program will only be executed if there is a program end flag in the application program of the power tool 300.

When the above abnormal situations occur, you need to restart or continue to write to the upgrade program. In one example, after the abnormal conditions occur, the upgrade program is rewritten, and the power tool 300 enters the forced upgrade mode. In the forced upgrade mode, once the upgrade device 500 is connected to the power tool 300, the power tool 300 no longer determines whether to enter the upgrade mode according to the voltage of the first tool terminal 341, instead the power tool 300 actively sends an upgrade request to the upgrade device 500. In this way, the upgrade program is rewritten.

Of course, in the case where the power tool 300 has the communication device 120, the upgrade file from the external device (for example, a mobile phone, a PC, etc.) can be acquired by the communication device. Then, the communication device or other modules are used to update the application program in the power tool 300 with alternative method, which may be a bus scheduling method or a general communication method to update the program of the power tool without upgrading the device 500.

(2) A method to update the program of the battery pack 200.

The method of updating the battery pack 200 program by the upgrade device 500 is similar to the method of upgrading the power tool 300 by the upgrade device 500.

The upgrade device 500 for program update of the battery pack 200 and the upgrade device 500 for program update of the power tool 300 may contain the same components, except that the upgrade programs stored in the two storage modules 502 are different, respectively the upgrade program for the battery pack 200 and the upgrade program for the power tool 300.

It should be noted that the power tool 300 updates the program in the non-operation mode after power-on, whereas the battery pack 200 may update the program at any time. The condition for the battery pack 200 to enter the upgrade mode may be to detect whether the voltage of the first battery pack terminal 231 indicates the upgrade device 500, or the battery pack 200 may directly send an upgrade request to the upgrade device 500 to enter the upgrade mode.

Specifically, when an external device such as the charger or the upgrade device 500 or the power tool 300 is connected to the battery pack 200, after the battery pack 200 is powered on, firstly, the battery pack confirms which device is used according to the external device feedback signal, and when the battery pack 200 confirms it to be the upgrade device 500, the battery pack 200 sends its own identity information to the upgrade device 500, and prepares for upgrade.

Figure 20:
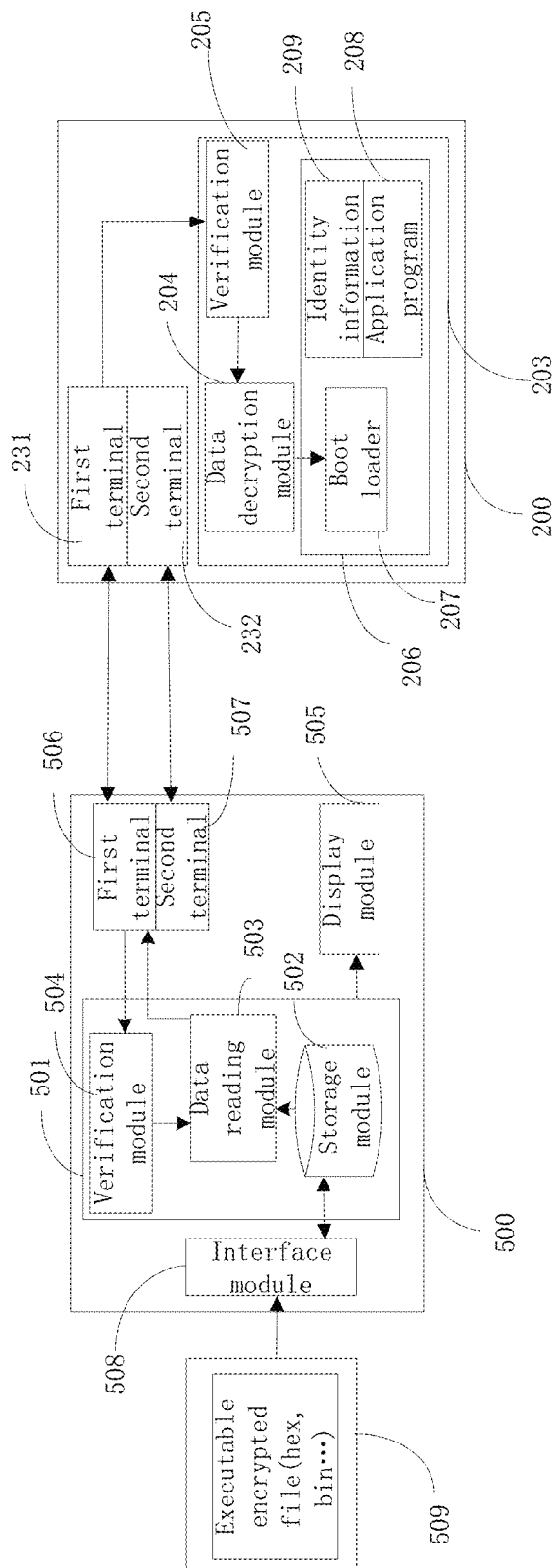
FIG. 20 is a schematic diagram of the internal structure of the upgrade device and the battery pack.

Referring to FIG. 20, the battery pack 200 has two physical terminals, a first battery pack terminal 231 and a second battery pack terminal 232. The upgrade device 500 has a first upgrade terminal 506 and a second upgrade terminal 507 corresponding thereto, respectively connected to the first battery pack terminal 231 and the second battery pack terminal 232.

In the method in which the battery pack 200 sends its own identity information 209 to the upgrade device 500 to request to enter the upgrade mode, it is necessary to set an upgrade flag in the battery pack 200 in advance. The upgrade identifier can be written to the flash memory 206 or other storage module of the MCU of the battery pack 200 by an external device using a wireless or wired manner. When the upgrade device 500 is connected to the battery pack 200, if the battery pack 200 is detected to store the upgrade identifier, the upgrade key is sent to the battery pack 200, and the MCU 203 of the battery pack 200 executes the boot loader 207, writes the upgrade program in the storage module 502 of the upgrade device 500 to the memory partition of the application program of the battery pack 200, and update the application program of the battery pack 200, otherwise the program update process is not launched. Once the upgrade program is executed, regardless of whether the upgrade was successful or not, the upgrade ID is cleared to prevent the boot loader from being executed multiple times.

Figure 21:
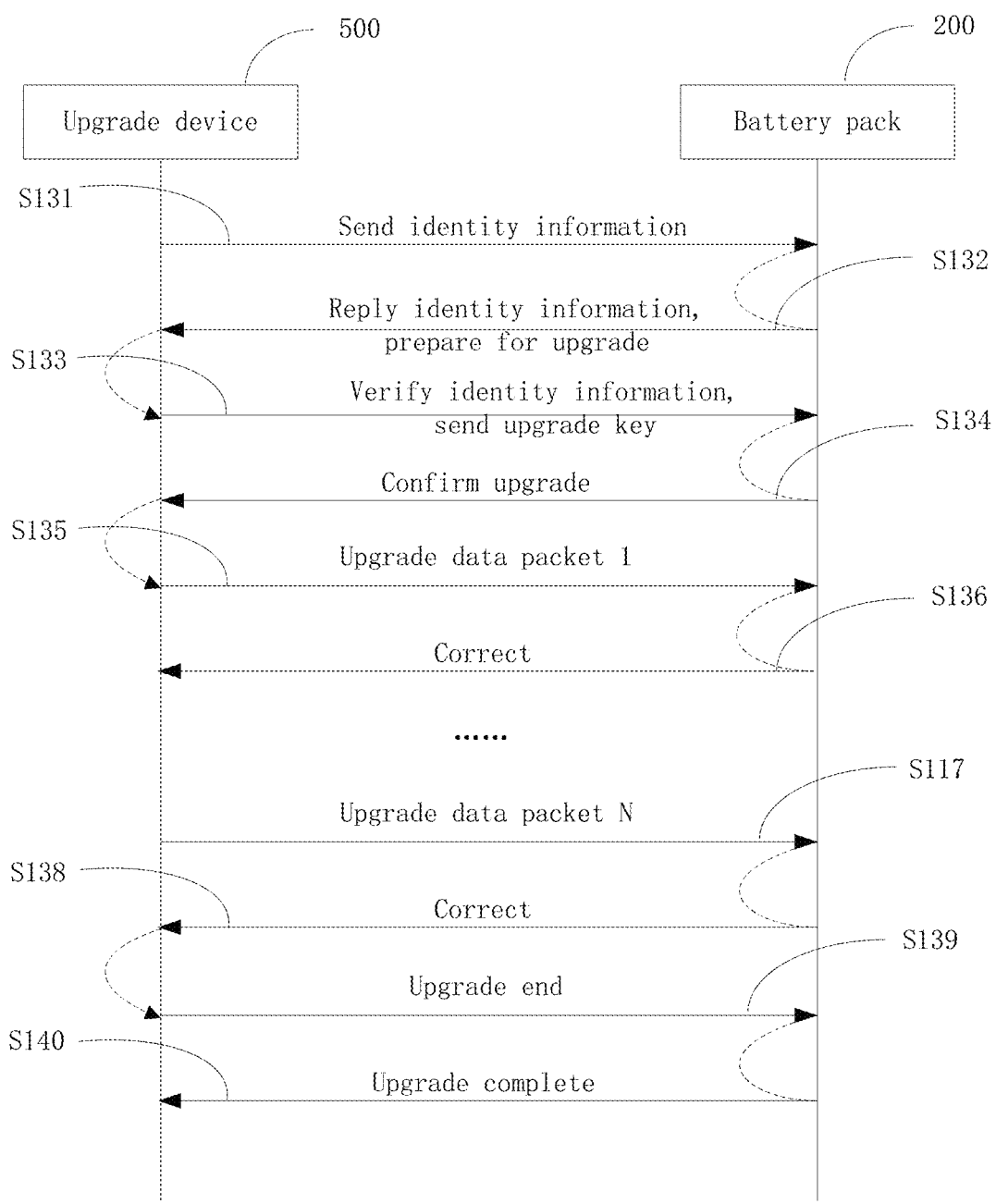
FIG. 21 is the information exchange process between the upgrade device and the battery pack shown in FIG. 20 in the upgrade mode.

Referring to FIG. 21, the information exchange process of the upgrade device 500 and the battery pack 200 in the upgrade mode is as follows:

S131: The upgrade device 500 sends its own identity information to the battery pack 200;

S132: The battery pack 200 receives the identity information of the upgrade device 500, replies its own identity information to the upgrade device 500 and prepares for the upgrade;

S133: The upgrade device 500 verifies the identity information of the battery pack 200, determines whether to perform the upgrade, and if the upgrade is possible, sends the upgrade key to the battery pack 200;

The upgrade device 500 determines whether to upgrade. Specifically, it is necessary to determine the following: First, whether the identity information of the battery pack 200 is in line with the upgrade device 500. The upgrade device 500 compares the received identity information of the battery pack 200 to the identity information 209 of one or more battery packs 200 stored in the storage module 502 in advance to determine whether the received identity information is stored in the storage module 502. If so, the program update can be performed on the battery pack 200; if not, the program update cannot be performed. Second, whether there is an upgrade flag in the storage module of the battery pack 200. If so, the program update can be performed on the battery pack 200; if not, the program update cannot be performed.

S134: The battery pack 200 receives the upgrade key, confirms the upgrade, and replies the upgrade confirmation to the upgrade device 500;

S135: After receiving the upgrade confirmation information of the battery pack 200, the upgrade device 500 starts to send the first upgrade data packet;

S136: After receiving the data packet, the battery pack 200 checks whether the data packet is correct (whether the data packet sequence is correct, whether the data packet content is correct, etc.), if correct, replies the correct message to the upgrade device 500;

S137: After receiving the correct reply, the upgrade device 500 continues to send the next data packet until the last data packet;

S138: The battery pack 200 receives the last data packet and replies the correct message;

S139: The upgrade device 500 sends an upgrade end flag to the battery pack 200;

S140: After the battery pack 200 receives the upgrade end flag, the upgrade is completed.

Figure 22:
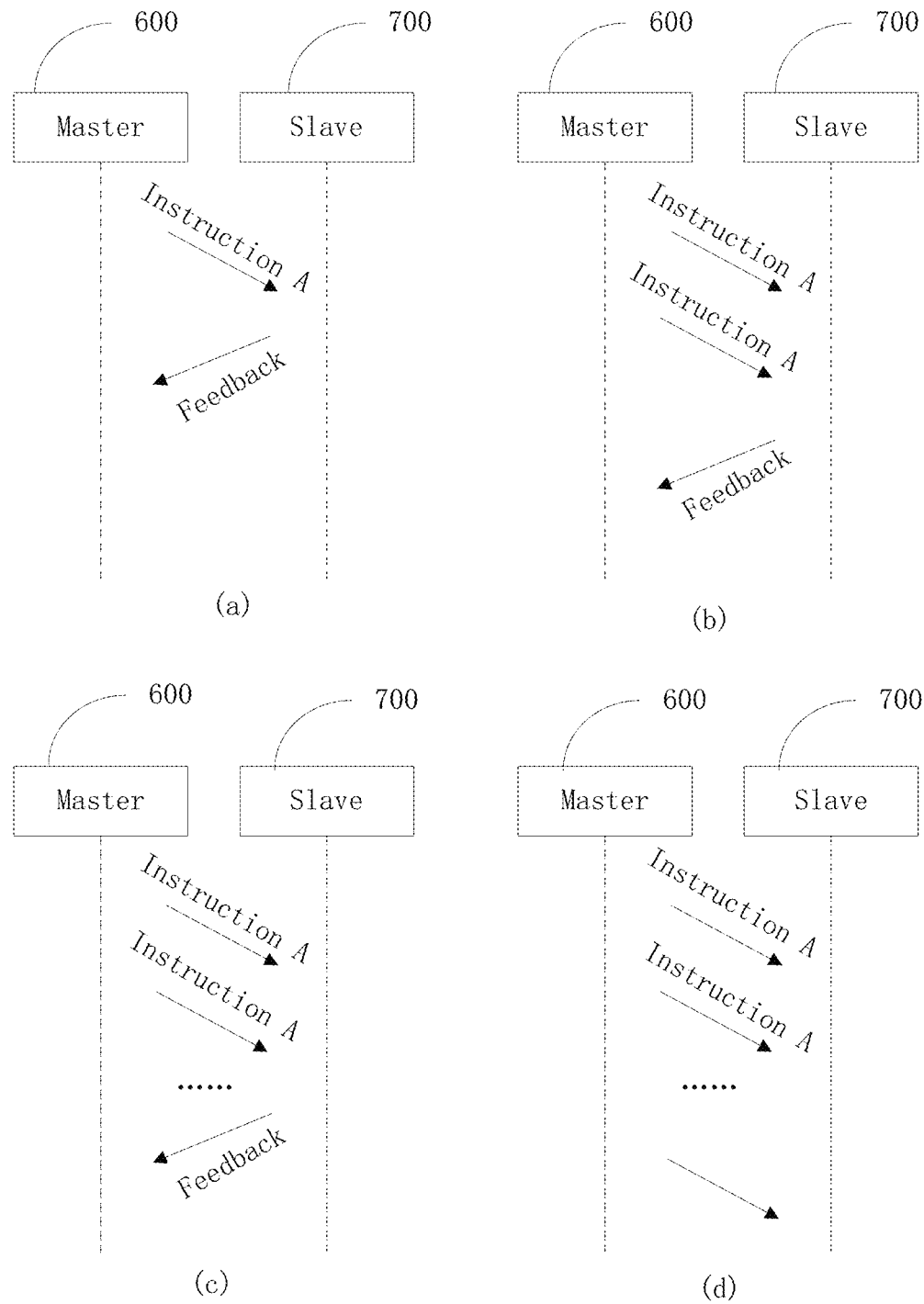
FIG. 22 is a schematic diagram of the timeout retransmission mechanism.

In the above data transmission processes, it is necessary to consider the possibility of data transmission timeout, and a timeout retransmission mechanism is introduced for this purpose. During the normal transmission process, the master 600 sends an instruction or data to the slave 700, and the slave 700 receives the instruction or data and feeds back to the master 600 to ensure that the transmission is normal (refer to FIG. 22). In the timeout transmission, the master 600 sends an instruction or data to the slave 700, the slave 700 does not feed back to the master 600 within a specified time, or the master 600 does not receive feedback from the slave 700 within a specified time. To ensure that the data can be transmitted effectively, perform the timeout retransmission as follows:

S151: After the master 600 sends an instruction or data to the slave 700, the timer starts;

S152: The master 600 determines whether the slave 700 replies within a specified time. If yes, send the next instruction or data to the slave 700, and go to step S151; if not, the instruction or data transmission is considered to be unsuccessful;

S153: The master 600 sends the same instruction or data to the slave 700 again;

S154: The master 600 determines whether the predetermined upper limit of the number of retransmissions is reached. If yes, it is considered that the transmission has failed, and go to step S156; if not, go to step S152;

S156: Terminate the transmission process.

In the above program update processes, the master 600 may be the communication device 120 or the upgrade tool, and the slave 700 may be the main control module 132, the inverter module 131, the power tool 300, or the battery pack 200. It should be noted that the upper limit of the number of retransmissions is set according to the specific conditions or requirements, for example, 3, 5, 10 times, etc., in order to save energy. After the transmission fails, the display module of the upgrade device 500 displays an alarm state to remind the user that the upgrade has failed.

The basic principles, main features and advantages of the present disclosure have been shown and described above. It should be understood by those skilled in the art that the above-described examples are not intended to limit the disclosure in any way, and the technical solutions obtained by means of equivalent replacement or equivalent transformation are all within the scope of the disclosure.

INDUSTRIAL APPLICABILITY

The present disclosure provides a battery pack that enables the battery pack and the electrical device to transmit at least two types of data by providing two sets of connection terminals on the battery pack, which facilitates maintenance staff to perform fault diagnosis and fault repair, thereby saving manpower and material resources.

What claimed is:

1. A battery pack comprising:
   a housing;
   a battery cell group accommodated in the housing, the battery cell group comprising a plurality of electrically connected battery cells; and
   a battery pack connection terminal group for connecting to an electrical device;
   wherein the battery pack connection terminal group comprises:
      a positive power terminal of the battery pack electrically connected to a positive pole of the battery cell group;
      a negative power terminal of the battery pack electrically connected to a negative pole of the battery cell group;
      a first battery pack terminal for transmitting a first type of data; and
      a second battery pack terminal for transmitting a second type of data,
   wherein the battery pack is mountable to the electrical device comprising:
      a positive power connection terminal and a negative power connection terminal respectively for connecting to the battery pack positive power terminal and the battery pack negative power terminal for transmitting electrical energy;
      a first connection terminal for connecting to the first battery pack terminal to transmit the first type of data; and
      a second connection terminal for connecting to the second battery pack terminal to transmit the second type of data, and
   the battery pack has a normal operation mode and a data transmission mode:
      in the normal operation mode, the first battery pack terminal transmits the first type of data for normal operation of the battery pack and/or the electrical device connected to the battery pack;
      in the data transmission mode, the second battery pack terminal transmits the second type of data for data analysis of the battery pack and/or the electrical device connected to the battery pack,
      wherein the battery pack comprises a controller and the controller controls the battery pack to switch between the normal operation mode and the data transmission mode,
      wherein the battery pack further comprises an identification resistor or a temperature sensor connected to the second battery pack terminal, the second battery pack terminal is used to transmit a one or more properties of the battery pack or a temperature of the battery pack in the normal operation mode, and at least one switching element electrically connected to the identification resistor or the temperature sensor to turn on or off the electrical connection between the identification resistor or the temperature sensor and the second battery pack terminal and wherein the controller is configured to control an on-off state of the switching element to switch the battery pack to the normal operation mode or the data transmission mode.

2. The battery pack of claim 1, wherein the battery pack switches to the data transmission mode after the normal operation mode ends.

3. The battery pack of claim 1, wherein the electrical device comprises identity information, the identity information indicates whether the electrical device has a wireless communication module, the wireless communication module is configured to establish a wireless communication connection between the electrical device and an external device, the electrical device is able to send the second type of data to the external device through the wireless communication module, the external device comprises a wireless communication module, the external device has data processing and analysis functions, and the first battery pack terminal is configure to obtain the identity information of the electrical device.

4. The battery pack of claim 1, wherein the battery pack comprises an identification resistor or a temperature sensor connected to the second battery pack terminal, the second battery pack terminal is used to transmit a one or more properties of the battery pack or a temperature of the battery pack in the normal operation mode, at least one switching element electrically connected to the identification resistor or the temperature sensor to turn on or off the electrical connection between the identification resistor or the temperature sensor and the second battery pack terminal, and a controller at least for controlling an on-off state of the switching element and wherein the controller is configured to determine whether the electrical device has a wireless communication module based on the identity information of the electrical device obtained by the first battery pack terminal and, if it is determined that the electrical device has a wireless communication module, the controller controls the switching element to turn off the electrical connection between the identification resistor or the temperature sensor and the second battery pack terminal so that the second battery pack terminal transmits the second type of data for data analysis.

5. The battery pack of claim 1, wherein the second type of data comprises at least one of history data, statistical data, and real-time data.

6. The battery pack of claim 5, wherein the battery pack and/or the electrical device comprises a memory, data is stored in specified partitions of the memory based on whether data is one of a history data, a statistical data and a real-time data, and, when the specified partition is used up, current data overwrites original data.

7. The battery pack of claim 1, wherein the battery pack has a wireless communication module for establishing a wireless communication connection with an external device, the battery pack can send the second type of data to the external device through the wireless communication module, the external device has a wireless communication module, and the external device has data processing and analysis functions.

8. The battery pack of claim 1, wherein the electrical device has a wireless communication module for establishing a wireless communication connection with an external device, the electrical device can send the second type of data to the external device through the wireless communication module, the external device has a wireless communication module, and the external device has data processing and analysis functions.

9. The battery pack of claim 8, wherein the electrical device and the battery pack have a unique identifier and the second type of data comprises the unique identifier.

10. The battery pack of claim 9, wherein the external device is configured to delete duplicate data.

11. The battery pack of claim 1, wherein the electrical device is a power tool, a charger, or a portable power supply device.

12. The battery pack of claim 1, wherein at least one of the first battery pack terminal and the first connection terminal has a first data transmission rate and at least one of the second battery pack terminal and the second connection terminal has a second data transmission rate that is higher than the first data transmission rate.

13. The battery pack of claim 1, wherein the first type of data comprises current state data of the battery pack and/or current operating condition data of the electrical device and the second type of data comprises at least one of current state data, historical state data, and usage data of the battery pack, and/or at least one of current operating condition data, historical operating condition data and usage data of the electrical device.

* * * * *

UNITED STATES PATENT AND TRADEMARK OFFICE
CERTIFICATE OF CORRECTION

Page 1 of 1

PATENT NO. : 11,094,969 B2
APPLICATION NO. : 16/887664
DATED : August 17, 2021
INVENTOR(S) : Yang et al.

It is certified that error appears in the above-identified patent and that said Letters Patent is hereby corrected as shown below:

On the Title Page

Add:
Item (30) Foreign Application Priority Data
December 21, 2017 (CN) 201711392631.2

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*